US012662747B2

(12) United States Patent　(10) Patent No.: US 12,662,747 B2
Chapman et al.　(45) Date of Patent: Jun. 23, 2026

(54) MOUNTING STRUCTURE FOR A RECTIFIER CIRCUIT OF AN ELECTRODEPOSITION DEVICE

(71) Applicant: Redwood Materials, Inc., Carson City, NV (US)

(72) Inventors: Patrick Chapman, Reno, NV (US); Jaesoo Byoun, Reno, NV (US); David Okawa, Reno, NV (US); Anton Hunt, Reno, NV (US); Isaac Thomas, Carson City, NV (US); Guillermo Urquiza, Reno, NV (US); Roger Bishop, Dayton, NV (US)

(73) Assignee: Redwood Materials, Inc., Carson City, NV (US)

( * ) Notice: Subject to any disclaimer, the term of this patent is extended or adjusted under 35 U.S.C. 154(b) by 333 days.

(21) Appl. No.: 18/485,913

(22) Filed: Oct. 12, 2023

(65) Prior Publication Data

US 2024/0162811 A1 May 16, 2024

Related U.S. Application Data

(60) Provisional application No. 63/503,830, filed on May 23, 2023, provisional application No. 63/383,128, filed on Nov. 10, 2022.

(51) Int. Cl.
*C25D 17/00* (2006.01)
*C25D 1/04* (2006.01)
(Continued)

(52) U.S. Cl.
CPC ............... *C25D 17/00* (2013.01); *C25D 1/04* (2013.01); *C25D 21/12* (2013.01);
(Continued)

(58) Field of Classification Search
CPC ........... C25D 17/00; C25D 17/02; C25C 7/02
See application file for complete search history.

(56) References Cited

U.S. PATENT DOCUMENTS 9,018,802 B2 * 4/2015 Sun ........................ C25D 11/00
307/106
2007/0261953 A1 * 11/2007 Kohler ................... C25D 13/22
204/230.2
(Continued)

OTHER PUBLICATIONS

U.S. Appl. No. 18/485,921, filed Aug. 15, 2025, Office Action.
(Continued)

*Primary Examiner* — Gary A Nash
(74) *Attorney, Agent, or Firm* — Keller Preece PLLC

(57) ABSTRACT

The present disclosure relates to systems, non-transitory computer-readable media, and methods for applying controllable current to portions of an electrodeposition device via a series-in-parallel-out rectifier circuit. In particular, the rectifier circuit includes a front-end stage that includes an alternating current-to-direct current converter circuit to generate one or more direct current signals from an alternating current signal of an input terminal. Additionally, the rectifier circuit includes a back-end stage including a plurality of direct current-to-direct current converter circuits that convert the one or more direct current signals into a plurality of child direct current signals. Furthermore, the plurality of direct current-to-direct current converter circuits of the disclosed series-in-parallel-out rectifier circuit are in physical contact with an anode of the electrodeposition device at a plurality of different positions to apply separate currents to different portions of the anode.

20 Claims, 27 Drawing Sheets

(51) Int. Cl.

| | |
|---|---|
| *C25D 21/12* | (2006.01) |
| *H01L 21/288* | (2006.01) |
| *H02M 1/00* | (2006.01) |
| *H02M 3/00* | (2006.01) |
| *H02M 3/04* | (2006.01) |
| *H02M 7/04* | (2006.01) |
| *H02M 7/537* | (2006.01) |
| *H05K 7/14* | (2006.01) |
| *C25C 7/02* | (2006.01) |

(52) U.S. Cl.

CPC ...... *H01L 21/2885* (2013.01); *H02M 1/0048* (2021.05); *H02M 3/003* (2021.05); *H02M 3/04* (2013.01); *H02M 7/04* (2013.01); *H02M 7/537* (2013.01); *H05K 7/14322* (2022.08); *C25C 7/02* (2013.01)

(56) References Cited

U.S. PATENT DOCUMENTS

| | | | |
|---|---|---|---|
| 2012/0119591 A1 | 5/2012 | Sun et al. | |
| 2012/0160703 A1 | 6/2012 | Koehl et al. | |
| 2015/0191840 A1 | 7/2015 | Grant | |
| 2018/0274122 A1* | 9/2018 | Guskov | H02M 3/335 |
| 2019/0074775 A1 | 3/2019 | Chimento et al. | |
| 2022/0140739 A1 | 5/2022 | Liu et al. | |
| 2024/0158946 A1 | 5/2024 | Chapman et al. | |

OTHER PUBLICATIONS

International Search Report and Written Opinion as received in PCT/US2023/076847 dated May 22, 2024.

U.S. Appl. No. 18/485,921, filed Mar. 3, 2026, Office Action.

* cited by examiner

MOUNTING STRUCTURE FOR A RECTIFIER CIRCUIT OF AN ELECTRODEPOSITION DEVICE

CROSS-REFERENCE TO RELATED APPLICATIONS

This application claims priority to and the benefit of U.S. Provisional Patent Application No. 63/383,128, filed on Nov. 10, 2022 and U.S. Provisional Patent Application No. 63/503,830, filed on May 23, 2023, which are incorporated herein by reference in their entirety.

BACKGROUND

Increases in the capability of electronic devices have led to a significant increase in the availability and use of such electronic devices in many different scenarios. For example, improvements to battery technology have resulted in the increased use of batteries as an alternative to fossil fuels and other sources of energy. Accordingly, the recent surge in popularity of electric vehicles and other electronic devices has resulted in a significant increase in demand for efficient electronics and battery production, including the production of copper foil for batteries or other electronic device components via electrodeposition processes.

Despite increased production and availability of electronic devices and batteries in various fields of use, existing machines for electrodeposition processes are inefficient and bulky. Specifically, conventional electrodeposition devices for generating copper foil or for electroplating large surfaces take up a significant amount of space and are very heavy. For example, conventional electrodeposition devices that generate a current output high enough for industrial applications of copper foil generation and electroplating processes require power electronics components and bus bars that weigh hundreds of kilograms and take up a large amount of space. These conventional systems also utilize rectifier circuits that inefficiently convert input signals to output signals, resulting in high power usage due to electrical inefficiency and power loss during operation.

SUMMARY

Embodiments of the present disclosure provide benefits and/or solve one or more of the foregoing or other problems in the art with systems, apparatuses, circuits, non-transitory computer-readable media, and methods that solve the foregoing problems (in addition to providing other benefits) by providing a rectifier circuit that generates a plurality of parallel current signals for an electrodeposition device. For example, an electrodeposition device can include an anode (e.g., an anode bath) and a cathode (e.g., a cathode drum) to deposit material on a surface of the cathode via one or more applied currents through an electrolytic material between the anode and the cathode drum by the rectifier circuit. The electrodeposition device can utilize the rectifier circuit to apply a plurality of current signals across a surface of the anode for even electrodeposition of a material via the electrodeposition device.

In one or more embodiments, the rectifier circuit includes a front-end stage with an alternating current-to-direct current converter circuit that generates one or more direct current voltage signals from an alternating current voltage signal of an input terminal. Additionally, the rectifier circuit includes a back-end stage with a plurality of direct current-to-direct current converter circuits that convert the one or more direct current voltage signals generated by the front-end stage into a plurality of child direct current voltage signals. Furthermore, in one or more additional embodiments, the plurality of direct current-to-direct current converter circuits of the disclosed series-in-parallel-out rectifier circuit are in physical contact with the anode of the electrodeposition device at a plurality of different positions to apply separate currents to different portions of the anode.

Additionally, in one or more embodiments, one or more portions of the rectifier circuit are mounted to a portion of the electrodeposition device via one or more mounting structures. Specifically, a mounting structure connects a portion of the rectifier circuit (e.g., a direct current-to-direct current converter circuit of the back-end stage) physically, electrically, and thermally to the portion of the electrodeposition device (e.g., to an outer surface of an anode of the electrodeposition device). For example, the mounting structure includes an electrically conductive bung element that provides a physical and electrical connection between the rectifier circuit and the portion of the electrodeposition device. Additionally, the mounting structure includes a thermally conductive base element (e.g., aluminum), in which the bung element is at least partially disposed, that conducts heat generated by the rectifier circuit to the portion of the electrodeposition device. Thus, the disclosed series-in-parallel-out rectifier circuit provides an electrically efficient, lightweight, customizable current source for an electrodeposition device.

Additional features and advantages of one or more embodiments of the present disclosure are outlined in the description which follows, and in part will be obvious from the description, or may be learned by the practice of such example embodiments.

BRIEF DESCRIPTION OF THE DRAWINGS

The detailed description provides one or more embodiments with additional specificity and detail through the use of the accompanying drawings, as briefly described below.

DETAILED DESCRIPTION

Figure 1:
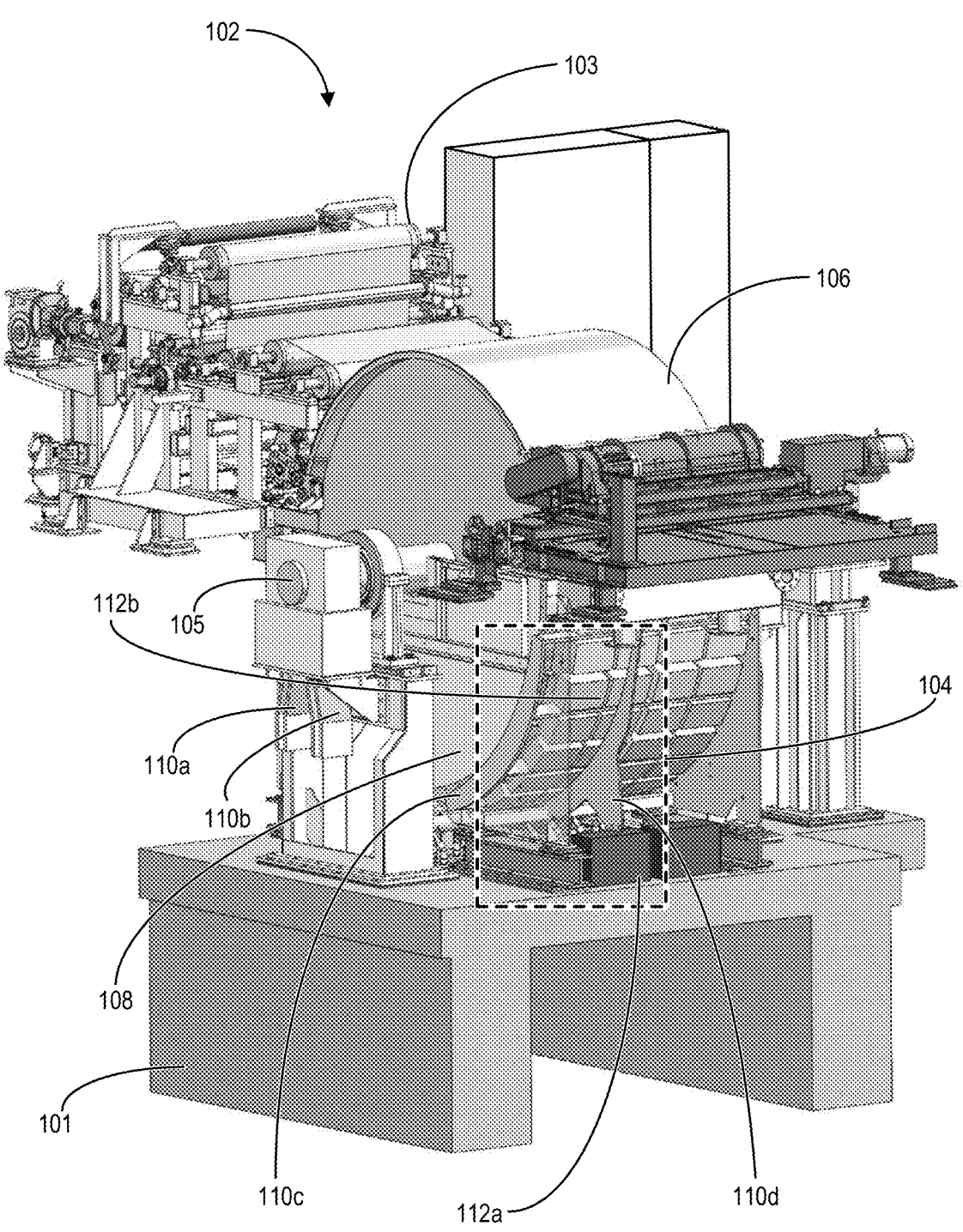
FIG. 1 illustrates a perspective view of an electrodeposition device in accordance with one or more implementations.

This disclosure describes one or more embodiments of an electrodeposition system that utilizes a series-in-parallel-out rectifier circuit to apply controllable current to different locations of an electrodeposition device. Specifically, the electrodeposition system includes an electrodeposition device to deposit a material on a surface via electrolysis (e.g., to create copper foil). Additionally, the electrodeposition system includes a series-in-parallel-out rectifier circuit that converts an alternating current signal to a plurality of child direct current signals via a plurality of separate brick components in physical and electrical contact with a surface of an anode of the electrodeposition device. For example, the brick components include separate converter circuits that subdivide the alternating current signal into the child direct current signals to apply to different positions of the anode surface via a plurality of mounting structures. Furthermore, in one or more embodiments, the electrodeposition system includes a controller to manage electrodeposition processes by dynamically producing specific currents to the different portions of the electrodeposition device via the series-in-parallel-out rectifier circuit.

As mentioned, in one or more embodiments, the electrodeposition system includes an electrodeposition device for depositing a material on a surface via electrolysis. For example, the electrodeposition device includes an electrodeposition machine that generates copper foil by electrolytic deposition of copper in a thin sheet onto a cathode (e.g., a cathode drum) via an applied current through an electrolyte (e.g., an electrolytic bath) between an anode of the electrodeposition machine and the cathode. Additionally, the electrodeposition system includes a rectifier circuit that converts an alternating current signal to a direct current signal to conduct a current through the electrolyte (e.g., from the cathode drum to the anode or vice-versa).

According to one or more embodiments, the electrodeposition system utilizes a series-in-parallel-out rectifier circuit to apply current to the electrodeposition device. In particular, the series-in-parallel-out rectifier circuit subdivides an input signal (e.g., a three-phase alternating current signal) into a plurality of child signals (e.g., separate direct current signals smaller than the input signal). For instance, the series-in-parallel-out rectifier circuit includes a front-end stage with an alternating current-to-direct current converter circuit that converts the input signal from alternating current to one or more direct current signals. Furthermore, the series-in-parallel-out rectifier circuit includes a back-end stage that converts the one or more direct current signals to a plurality of child direct current signals.

In one or more embodiments, the series-in-parallel-out rectifier circuit includes a plurality of brick components that attach to different portions of the electrodeposition device (e.g., to different locations of an anode of the electrodeposition device). Specifically, each brick component includes a separate converter circuit that generates an output signal with a lower voltage than the input signal. Furthermore, in some embodiments, the output voltage signals of the separate converter circuits are approximately equal and have controllable currents. The electrodeposition system thus provides controllable currents applied to different physical portions of the electrodeposition device, resulting in consistent current through the electrolytic material for consistent deposition of material on a surface (e.g., a surface of the cathode drum).

In one or more embodiments, the electrodeposition system utilizes a plurality of mounting structures to attach portions of the rectifier circuit to portions of the electrodeposition device. For example, a mounting structure includes an electrically conductive bung element disposed at least partially within a thermally conductive base element. The bung element can be physically and electrically in contact with a portion of the rectifier circuit (e.g., a direct current-to-direct current converter circuit of a back-end stage) to conduct current from the portion of the rectifier circuit to a surface of an anode of the electrodeposition device. The base element can be coupled to the surface of the anode (e.g., via contact pressure) to provide thermal conductivity between components of the rectifier circuit and the anode of the electrodeposition device. Additionally, in some embodiments, each mounting structure includes an enclosure that provides electrical insulation and protection for components of the rectifier circuit.

According to one or more embodiments, a series-in-parallel-out rectifier circuit includes a configuration of block components in a parallel-in-parallel-out configuration. In particular, the series-in-parallel-out rectifier circuit can include a front-end stage that converts an alternating current signal into a plurality of direct current signals. Additionally, the series-in-parallel-out can include a plurality of direct current-to-direct current converter circuits connected in parallel that reduce each of the direct current signals to a plurality of child direct current signals with reduced voltages. In alternative embodiments, the series-in-parallel-out rectifier circuit includes a configuration of block components in a series-in-parallel-out configuration. Specifically, a plurality of direct current-to-direct current converter circuits in series (e.g., daisy-chained) subdivide a single direct current signal generated by the front-end stage into a plurality of child direct current signals with reduced voltages.

In some embodiments, the electrodeposition system includes a plurality of series-in-parallel-out rectifier circuits for an electrodeposition device. To illustrate, the electrodeposition system can include a plurality of different series-in-parallel-out rectifier circuits, each having its own front-end stage and back-end stage(s). Accordingly, each series-in-parallel-out rectifier circuit includes a separate set of brick components attached to different portions of the electrodeposition device to apply consistent current from one or more high-voltage, high-current input signals.

The disclosed electrodeposition system provides a number of advantages over conventional systems. For example, by utilizing a series-in-parallel-out rectifier circuit with an electrodeposition device, the electrodeposition system provides controllable current across a surface (e.g., a surface of a cathode drum) of the electrodeposition device for consistent deposition of material across the surface. In contrast to conventional systems that utilize single-in-single-out rectifier circuits to produce a single current source to deposit material in an electrodeposition device, the electrodeposition system provides a plurality of individually controllable current sources at different locations across a surface of an electrodeposition device. To illustrate, the electrodeposition system utilizes a series-in-parallel-out rectifier circuit including a plurality of individually controllable converter circuits positioned at different locations of the electrodeposition device to control current from the cathode drum to the anode at the different locations. In additional embodiments, the electrodeposition system utilizes a rectifier circuit with a plurality of separate converter circuits to apply a similar/equal current to a plurality of different locations of the electrodeposition system, which can prevent uneven deposition of material onto a surface.

Additionally, by utilizing a series-in-parallel-out rectifier circuit with a plurality of separate brick components attached to an anode of an electrodeposition device, the electrodeposition system provides improved electrical efficiency of the electrodeposition device. In contrast to conventional electrodeposition devices that utilize a single current source to drive current for material deposition via electrolysis, the electrodeposition system provides improved electrical efficiency via the series-in-parallel-out rectifier circuit. In particular, utilizing the series-in-parallel-out rectifier circuit to convert an alternating current signal to one or more direct current signals via the front-end stage of the rectifier circuit and convert the one or more direct current signals to a plurality of child direct current signals with reduced voltage via the back-end stage increases electrical efficiency over the conventional systems. More specifically, the electrodeposition system utilizes the series-in-parallel-out rectifier circuit to efficiently convert and step a high voltage, high current alternating current input signal down to a plurality of lower voltage direct current output signals. To illustrate, the electrodeposition system provides a series-in-parallel-out rectifier circuit with ~97% electrical efficiency and improved thermal management while also providing independently regulated currents at the output signals.

Furthermore, utilizing a series-in-parallel-out rectifier circuit with separately controlled brick components reduces a size and weight of electrodeposition devices. Specifically, in contrast to conventional systems that utilize large, electrically conductive components in connection with a single current source for electrodeposition processes, the electrodeposition system utilizes separate brick components with lightweight mounting structures to provide a plurality of separate current sources for electrodeposition processes. For example, while conventional systems can require bus bars that weigh hundreds of kilograms to conduct a single low voltage, high current signal, separating a high voltage, high current signal into a plurality of parallel output signals with reduced voltage allows the electrodeposition system to utilize much smaller bus bars (e.g., weight ~50 pounds) and/or eliminating certain bus bars (e.g., by using small wires or attaching the brick components directly to an anode of an electrodeposition device). Accordingly, the electrodeposition system utilizes much less material, weighs significantly less, and takes up less space than conventional systems.

Additionally, the electrodeposition system provides improved flexibility via modularity of rectifier circuits. For example, by utilizing small direct current-to-direct current converter circuits that are directly mounted to an anode of an electrodeposition device, the electrodeposition system can provide modular series-in-parallel-out rectifier circuits. Specifically, the electrodeposition system can allow for adding or removing direct current-to-direct current converter circuits in a series-in-parallel-out rectifier circuit according to specification requirements. Furthermore, the modular rectifier circuits allow for simple upgrading or replacing of aged or broken components. The plurality of direct current-to-direct current converter circuits in a series-in-parallel-out rectifier circuit can also provide improved fault tolerance in case one or more direct current-to-direct current converter circuits fails by continuing to push current through the remaining direct current-to-direct current converter circuits. In some embodiments, the electrodeposition system can also make up for failed converter circuits by pushing more current through the remaining converter circuits.

As illustrated by the foregoing discussion, the present disclosure utilizes a variety of terms to describe features and advantages of the disclosed systems. Additional detail is now provided regarding the meaning of such terms. For example, as used herein, the term "electrodeposition device" refers to a machine that deposits material onto a surface via electrolysis. For example, an electrodeposition device includes a machine that generates copper foil by applying a current through an electrolytic material (e.g., an electrolytic bath) to deposit copper material onto a surface. In additional embodiments, an electrodeposition device includes an electroplating machine to deposit a different type of material onto a surface (e.g., onto a solid substrate). An electrodeposition device includes a cathode and an anode, which include electrically conductive components to push a current through the electrolytic material/cell.

Additionally, as used herein, the term "rectifier circuit" refers to a circuit that converts an alternating current into direct current. Specifically, a rectifier circuit receives an input voltage signal with an alternating current and converts the input signal into one or more output signals with a direct current. Furthermore, a series-in-parallel-out rectifier circuit receives a single input signal (e.g., a single source alternating current signal) and generates a plurality of output signals (e.g., a plurality of direct current signals). In one or more embodiments, a series-in-parallel-out rectifier circuit includes a front-end stage that converts an input voltage with an alternating current into one or more output voltages with a direct current. Additionally, in one or more embodiments, a series-in-parallel-out rectifier circuit includes a plurality of brick components (e.g., at a back-end stage) that convert one or more output voltages with a direct current from the front end stage into a plurality of output voltages with a direct current (e.g., stepped down voltages).

As used herein, the term "controller" refers to a device that sends one or more signals to another device to cause the other device to perform one or more operations. For example, a controller includes a computing device that sends signals to an electrodeposition device and/or a rectifier circuit to perform one or more operations. To illustrate, a controller sends electrical signals to converter circuits of a rectifier circuit to control current amounts output by the converter circuits and/or to control whether a given converter circuit outputs a signal. Additionally, a controller can receive signals from one or more devices for determining whether to send signals to the one or more devices (or to one or more other devices).

Turning now to the figures, FIG. 1 illustrates an embodiment of an electrodeposition system including an electrodeposition device 102 with a plurality of series-in-parallel-out rectifier circuits (e.g., a series-in-parallel-out rectifier circuit 104). Specifically, FIG. 1 illustrates that the electrodeposition device 102 includes a cathode 106 and an anode 108. Furthermore, the electrodeposition device 102 includes an electrolytic material (e.g., an electrolytic bath) within a space or recess between the cathode 106 (e.g., a titanium drum) and the anode 108 (e.g., a steel or titanium vat with a titanium interior) that forms the space around the cathode 106. In one or more embodiments, the electrodeposition device 102 generates a copper foil by depositing copper material on the cathode 106 while rotating the cathode 106 and applying a current through the electrolytic material via the cathode 106 and the anode 108.

As illustrated in FIG. 1, the electrodeposition device 102 also includes one or more bus bars 110a-110d to drive current through the electrolytic material (e.g., by providing power to the rectifier circuits). For example, a first set of bus bars (e.g., bus bars 110a-110b) provide an electrical connection to the cathode, such as by connecting to a rotating portion of the cathode 106. Additionally, a bus bar 110c may be mounted to the anode 108 to provide power to the back-end stages of the rectifier circuits.

The electrodeposition device 102 can also include one or more bus bars (e.g., bus bar 110d) that connects one or more portions of a rectifier circuit (e.g., the series-in-parallel-out rectifier circuit 104) to one or more other portions of the rectifier circuit. To illustrate, the bus bar 110d can connect a front-end stage of a series-in-parallel-out rectifier circuit to the brick components of a back-end stage of the series-in-parallel-out rectifier circuit. Alternatively, in place of one or more bus bars, the electrodeposition device 102 can include one or more sets of cables to conduct power to (or connect) one or more components of the electrodeposition device 102. Accordingly, the electrodeposition device 102 can include one or more cables to provide power or connect one or more portions of a rectifier circuit to the one or more other portions of the rectifier circuit (e.g., in place of the bus bar 110d).

Figure 11:
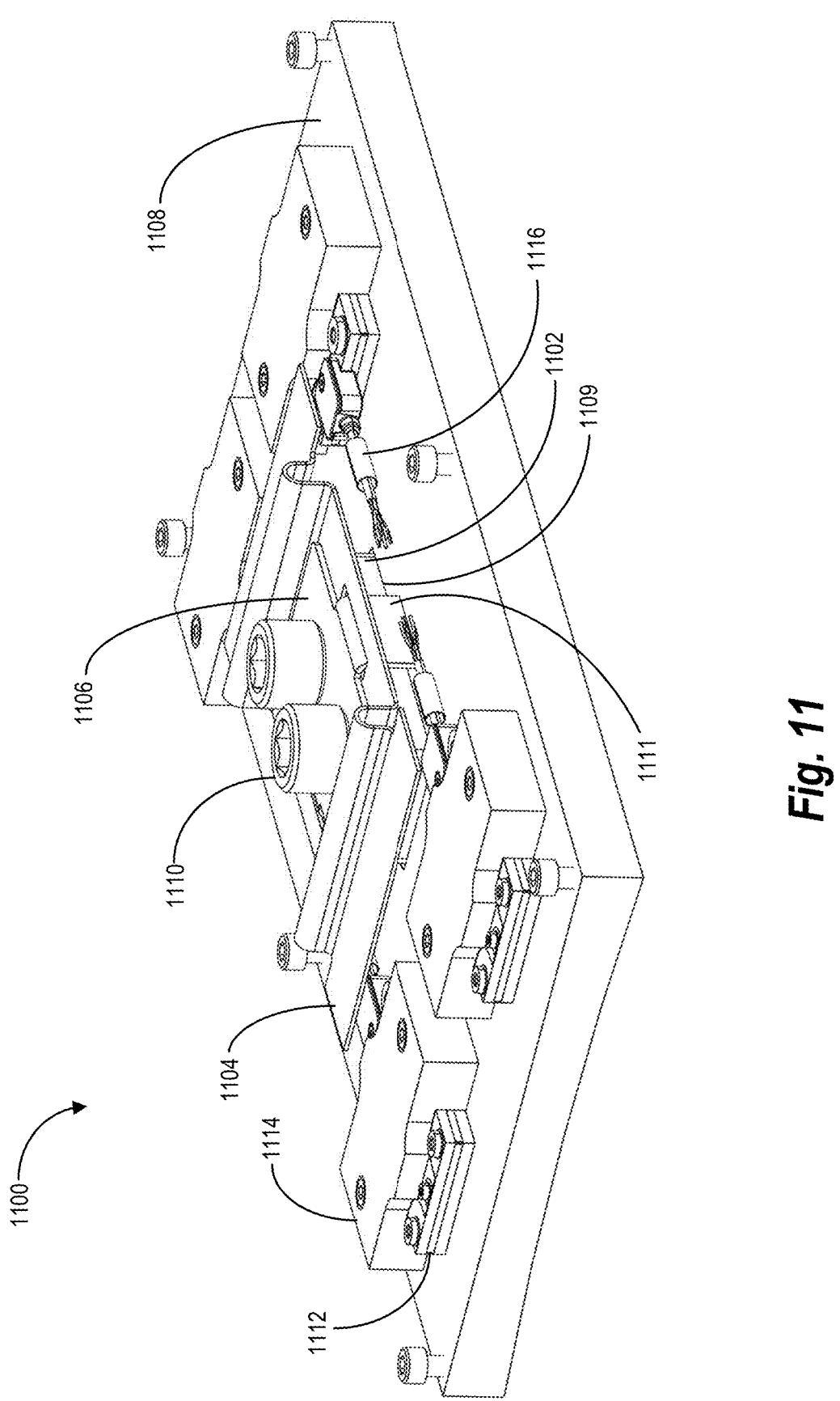
FIG. 11 illustrates an isometric view of a mounting structure for connecting a portion of a rectifier circuit to an electrodeposition device in accordance with one or more implementations.

In one or more embodiments, the electrodeposition system applies a current through the electrolytic material utilizing the series-in-parallel-out rectifier circuit 104. As illustrated in FIG. 1, the series-in-parallel-out rectifier circuit 104 includes a front-end stage 112a and a back-end stage 112b. Furthermore, the back-end stage 112b includes a plurality of brick components attached/mounted to the anode 108 of the electrodeposition device 102. To illustrate, the brick components are attached to an outer surface of the anode 108 at a plurality of different positions (e.g., evenly spaced or at specific predetermined locations). Accordingly, the brick components are in physical and electrical contact with the anode 108 at the plurality of positions. In additional embodiments, the brick components are thermally connected to the anode 108 to provide heat transfer to the anode 108. FIG. 11 and the corresponding description below provide additional detail associated with a mounting structure for each brick component, the mounting structure providing physical, electrical, and thermal contact between each brick component and the anode 108.

According to one or more embodiments, the electrodeposition system generates thin copper foil 103 (e.g., approximately 4 to 8 microns in thickness) with a width of approximately 1.5 meters and a length of approximately 6 to 10 kilometers. Specifically, the electrodeposition system generates the copper foil 103 via an electroplating/electrolysis process by driving current through the electrolytic material that includes various materials (e.g., copper and various additives). For example, the electrodeposition system utilizes the series-in-parallel-out rectifier circuit 104 to drive a current through the electrolytic material by regulating voltages and currents via the plurality of brick components. Furthermore, as illustrated, the electrodeposition device 102 can include a plurality of rectifier circuits with brick components attached to different portions of the anode 108, such that the electrodeposition device 102 includes up to four or more different series-in-parallel-out rectifier circuits driving current through the electrolytic material.

As the electrodeposition system drives current through the electrolytic material, copper is deposited onto the surface of the cathode 106. Because the amount of current determines the amount/speed of material deposition, the electrodeposition system utilizes the series-in-parallel-out rectifier circuit 104 to manage the current flow at different positions. The electrodeposition device 102 rotates the cathode 106 about an axis 105, and the electrodeposition system peels the copper foil 103 off of the cathode 106 as the cathode 106 rotates. Additionally, the electrodeposition system washes, cleans, and dries the copper foil 103 before rolling the copper foil 103. One or more systems can utilize the copper foil 103 for a variety of uses, such as battery production/recycling.

In one or more embodiments, the electrodeposition system includes a support structure 101 to support one or more components of the electrodeposition device 102. For instance, one or more components of the electrodeposition device 102 are mounted to the support structure 101, which rests on, or is affixed to, a floor or other base surface. To illustrate, one or more bus bars (e.g., the bus bars 110a-110b), the anode 108, and/or one or more portions of the series-in-parallel-out rectifier circuit 104 (e.g., the front-end stage 112a) are mounted to the support structure 101. As described herein, by utilizing a series-in-parallel-out rectifier circuit with a plurality of separate brick components connected to the anode 108, rather than a plurality of large rectifier cabinets, the electrodeposition system can support more components via the support structure 101 than conventional systems.

Figure 2:
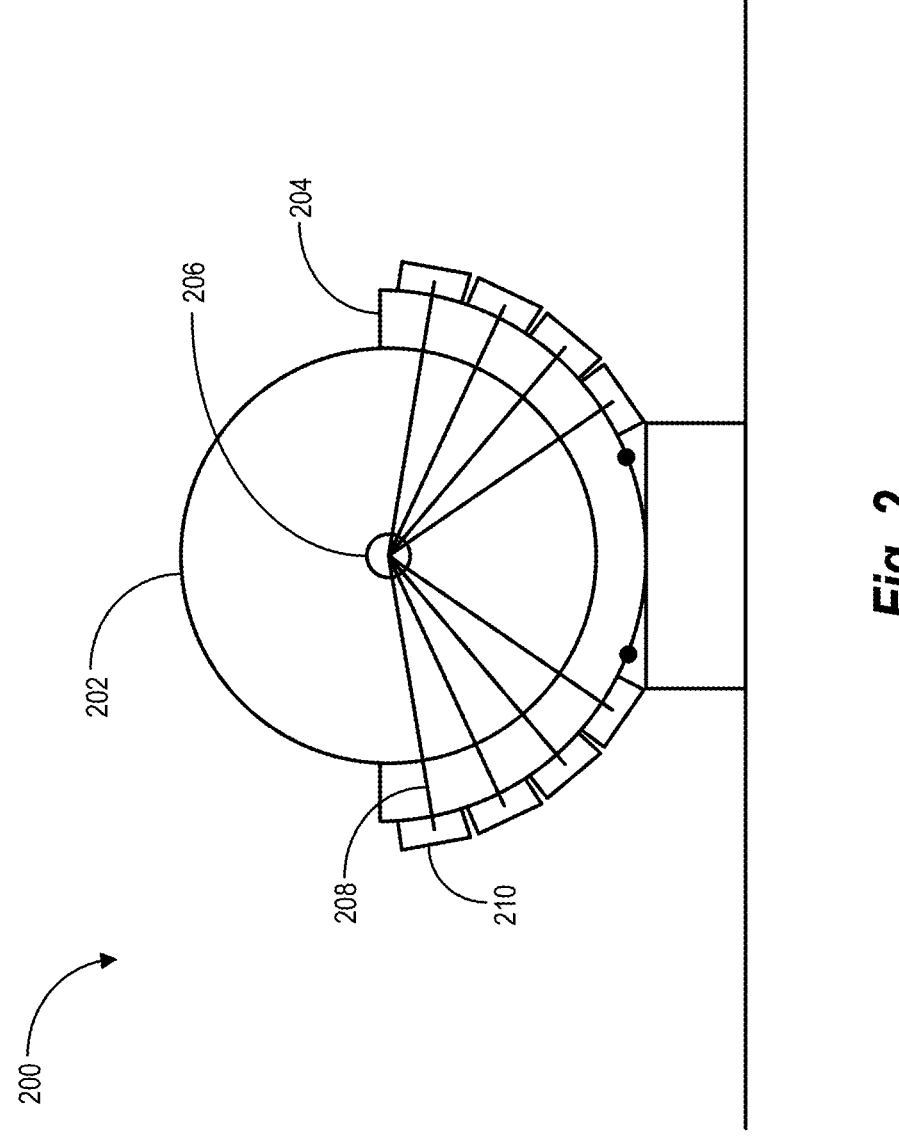
FIG. 2 illustrates a side view of an electrodeposition device including a rectifier circuit in accordance with one or more implementations.

FIG. 2 illustrates a simplified cross-section diagram of an electrodeposition device 200 of the electrodeposition system. Specifically, the electrodeposition device 200 includes a cathode 202 and an anode 204, which forms a space between the cathode 202 and the anode 204 for an electrolytic material. Additionally, the cathode 202 includes an axle 206 around which a drum of the cathode 202 rotates. Furthermore, FIG. 2 illustrates that the electrodeposition device 200 includes a plurality of brick components attached to the outer surface of the anode 204. For example, a brick component 210 including a direct current-to-direct current converter circuit of a series-in-parallel-out rectifier circuit is attached to the outer surface of the anode 204. The brick components can also be electrically connected via cables and/or bus bars (e.g., cable 208) to the axle 206 of the cathode 202. In one or more embodiments, connecting the brick components to the cathode 202 (e.g., via the axle 206) closes a circuit loop to allow driving of current through the electrolytic material between the cathode 202 and the anode 204.

As mentioned, the electrodeposition system provides improved electrical efficiency over conventional systems. In particular, because the brick components each receive and output signals with lower voltages and currents than conventional systems that use a single signal, the electrodeposition system can utilize lightweight bus bars that take up small amounts of space. Alternatively, the electrodeposition system can utilize cables/wires instead of bus bars (e.g., braided cables) to connect the components of a series-in-parallel-out rectifier circuit to components of the electrodeposition device 200. Furthermore, the electrodeposition system can utilize small bus bars and/or cables/wires to connect the brick components to the rectifier cabinets due to the low current and/or low voltage. Thus, in contrast to conventional systems that include large cabinets including rectifier circuits with large bus bars/bus bar connections (e.g., via large rectifier cabinets) to an electrodeposition machine, the electrodeposition device 200 of FIG. 2 eliminates the need for the large bus bars (and large rectifier cabinets) by utilizing the series-in-parallel-out rectifier circuits with brick components directly mounted to the anode 204.

In one or more embodiments, the electrodeposition system also provides heat dissipation via the electrolytic material of the electrodeposition device 200. For instance, because the brick components of a series-in-parallel-out rectifier circuit are physically mounted on the anode 204 (e.g., via a mounting structure as described in relation to FIG. 11), which includes the electrolytic material within an anode bath in a space between the anode 204 and the cathode 202, the electrodeposition system can utilize the anode 204 and the electrolytic material to conduct and dissipate heat produced by the brick components. Accordingly, the electrodeposition system can eliminate or reduce the number of heat sinks and/or fans in connection with the electrodeposition device 200 by dissipating heat via the electrolytic material. Furthermore, utilizing the series-in-parallel-out rectifier circuit with a plurality of brick components in a back-end stage separated from a front-end stage can also reduce the operating heat compared to conventional systems. In one or more additional embodiments, the heat dissipation via the electrolytic material offsets energy costs from heat generation devices by eliminating/reducing energy typically required to heat the bath.

Figure 3A:
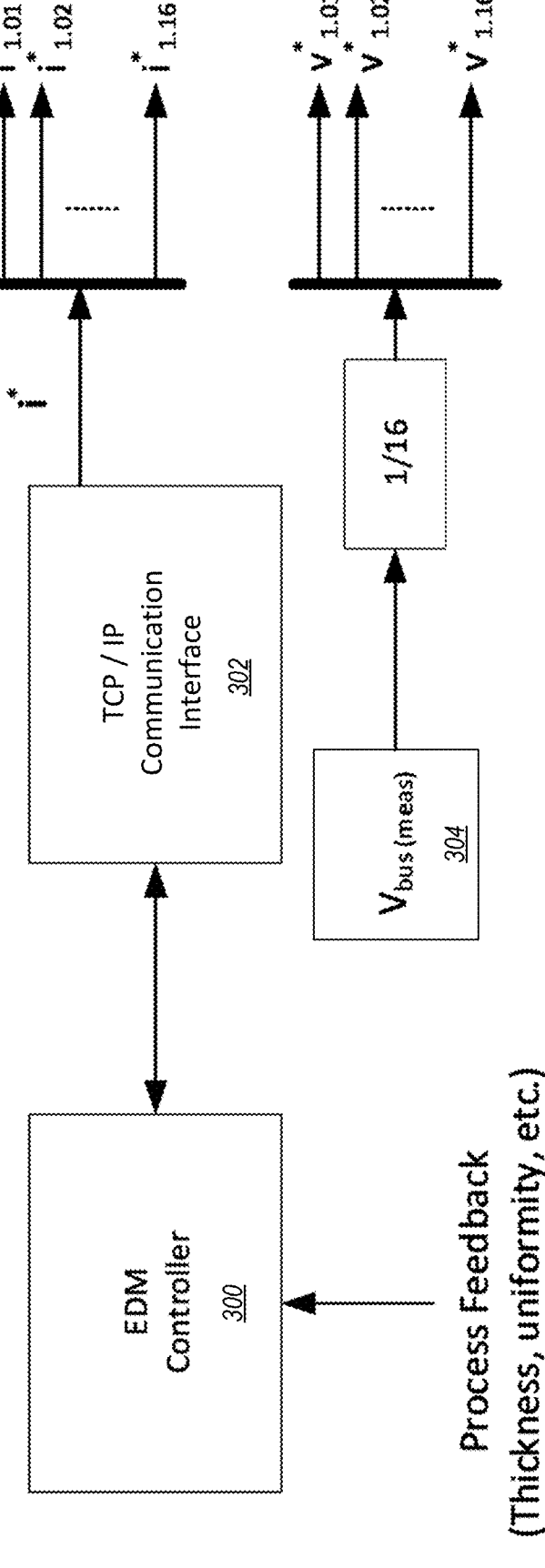
FIGS. 3A-3B illustrate a block diagram of a rectifier circuit for an electrodeposition device in accordance with one or more implementations.
Figure 3B:
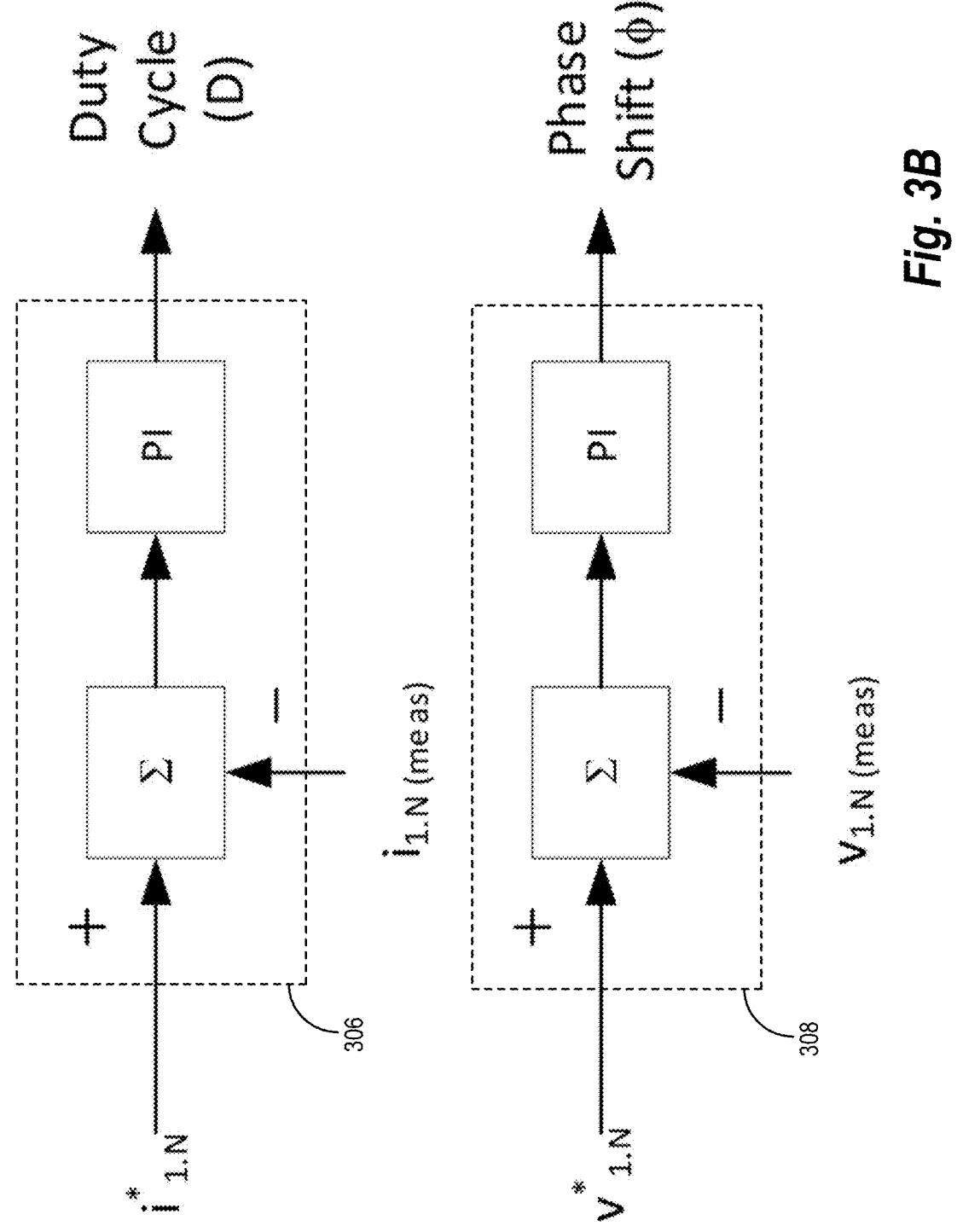

FIGS. 3A-3B illustrate diagrams of components of a series-in-parallel-out rectifier circuit. Specifically, FIG. 3A illustrates a diagram of a front-end stage of the series-in-parallel-out rectifier circuit including a controller for managing currents and/or voltages at a plurality of outputs of the rectifier circuit. Additionally, FIG. 3B illustrates a diagram of a back-end stage of the series-in-parallel-out rectifier circuit.

As illustrated in FIG. 3A, the front-end stage of the series-in-parallel-out rectifier circuit includes a controller 300 and a communication interface 302 for controlling current to a plurality of components (e.g., indicated by $i^*_{1.01}$, $i^*_{1.02}$, . . . , $i^*_{1.16}$). FIG. 3A also illustrates that the front-end stage generates the outputs to have a set of voltage signals (e.g., indicated by $v^*_{1.01}$, $v^*_{1.02}$, . . . , $v^*_{1.16}$), which may be approximately equal voltages (e.g., according to a voltage bus 304). For example, the electrodeposition system utilizes the controller 300 to determine whether to increase or reduce a current to one or more positions of an electrodeposition device via the back-end stage. Additionally, as described herein, the front-end stage can include additional components, such as an alternating current-to-direct current converter circuit to produce the currents to provide to the back-end stage.

In some embodiments, the electrodeposition system processes feedback from the electrodeposition device to determine a thickness and uniformity of the copper foil (or other characteristics of copper foil quality). For example, the electrodeposition system can include one or more sensors on or near a cathode to measure the attributes of the copper foil (or other material deposited onto the cathode). Based on the feedback, the electrodeposition system can utilize the controller 300 to send signals to one or more components at the back-end stage via the communication interface 302 (e.g., a TCP/IP interface) to increase or reduce the current provided to one or more components of the back-end stage. In one or more embodiments, the electrodeposition system also utilizes the controller 300 to control the voltage levels to one or more components of the back-end stage (e.g., to maintain equal voltages at the components of the back-end stage).

As described in more detail below, the front-end stage includes an alternating current-to-direct current converter circuit to convert a single input alternating current signal into one or more output direct current signals. Specifically, the front-end stage can convert the input signal into a single output signal for splitting into a plurality of child direct current signals at the back-end stage. Alternatively, the front-end stage can convert the input signal into a plurality of output signals for converting (and in some cases further splitting) to child direct current signals at the back-end stage.

FIG. 3B illustrates that the back-end stage includes a plurality of brick components, each including a direct current-to-direct current converter circuits controlled utilizing the controller 300. In particular, the back-end stage reduces direct current signals to lower voltages while the controller 300 of FIG. 3A controls current values provided by the direct current-to-direct current converter circuits to the electrodeposition device. For example, the back-end stage can include components to reduce voltages from a high voltage signal to a plurality of low voltage signals, such as from a plurality of 30-35 volt signals to a plurality of 6-8 volt signals).

In one or more embodiments, the electrodeposition system causes each brick component to regulate its own voltage and current during operation. To illustrate, the back-end stage includes a first set of components 306 to regulate a current for each brick component according to a duty cycle associated with the brick component (e.g., by adding or subtracting current from a particular signal). The back-end stage can also include a second set of components 308 to regulate a voltage for each brick component according to a particular phase associated with the brick component (e.g., by adding or subtracting voltage from a particular signal). In some examples, the controller provides commands to the direct current-to-direct current converter circuits to regulate the currents and/or voltages by fanning out commands to each of the components of the back-end stage according to one or more determined current and/or voltage values determined according to the feedback from the electrodeposition device. Furthermore, in some embodiments, the electrodeposition system achieves capacitor balancing at the brick components.

Figure 4A:
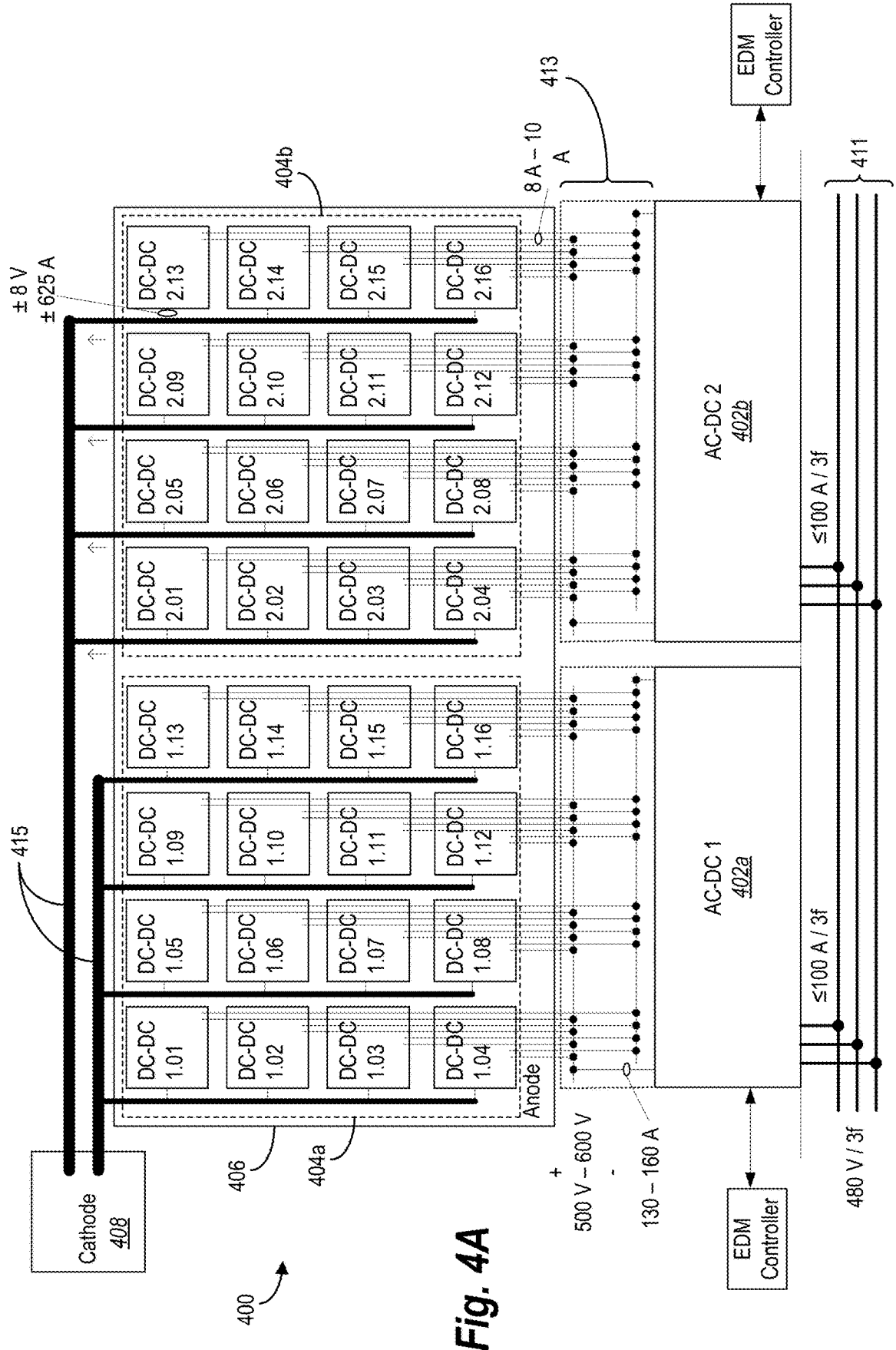
FIGS. 4A-4B illustrate block diagrams of various embodiments of an electrodeposition device including a rectifier circuit in accordance with one or more implementations.

FIG. 4A illustrates a diagram of an embodiment of one side of an electrodeposition device. Specifically, FIG. 4A illustrates an electrodeposition device 400 and a schematic diagram of plurality of series-in-parallel-out rectifier circuits in connection with the electrodeposition device 400. For example, a first series-in-parallel-out rectifier circuit includes a front-end stage including a first alternating current-to-direct current converter circuit 402a and a back-end stage including a first plurality of direct current-to-direct current converter circuits 404a. More specifically, the first plurality of direct current-to-direct current converter circuits 404a are mounted to an anode 406 of the electrodeposition device 400 at a first set of positions. Additionally, FIG. 4A illustrates a second series-in-parallel-out rectifier circuit including a front-end stage with a second alternating current-to-direct current converter circuit 402b connected to a back-end stage with a second plurality of direct current-to-direct current converter circuits 404b at a second set of positions of the anode 406. Furthermore, although FIG. 4A illustrates two series-in-parallel-out rectifier circuits with portions connected to a first side of the anode 406, in some embodiments, third and fourth series-in-parallel-out rectifier circuits can have back-end stages attached to a second side of the anode 406 (e.g., a second rounded outer surface of the anode 406 on an opposite side of the electrodeposition device 400).

In one or more embodiments, the first plurality of direct current-to-direct current converter circuits 404a are positioned along a first half or side of an outer surface of the anode 406. Additionally, the second plurality of direct current-to-direct current converter circuits 404b are positioned along a second half or side of the outer surface of the anode 406. Accordingly, the first series-in-parallel-out rectifier circuit can control current flowing through the first half/side of the anode, while the second series-in-parallel-out can control current flowing through the second half/side of the anode. In some embodiments, the direct current-to-direct current converter circuits of a particular rectifier circuit are positioned at equal intervals vertically and/or horizontally along the anode 406. Alternatively, the direct current-to-direct current converter circuits are positioned at different intervals depending on a shape or size of the anode and/or shapes or sizes of the direct current-to-direct current converter circuits.

In one or more embodiments, as illustrated in FIG. 4A, the plurality of series-in-parallel-out rectifier circuits convert an input signal from alternating current to direct current. For example, the electrodeposition device 400 receives a three-phase alternating current signal 411 (e.g., a 480 V, 60 Hz line voltage). The series-in-parallel-out rectifier circuits utilize alternating current-to-direct current converter circuits to convert the input signal to direct current voltages (e.g., one or more bus voltage signals of 500-600 V) for providing to the direct current-to-direct current converter circuits.

In one or more embodiments, the alternating current-to-direct current converter circuits provide the voltage signals to one or more child buses and/or one or more child bus cables that connect to from the alternating current-to-direct current converter circuits to the direct current-to-direct current converter circuits. To illustrate, the first alternating current-to-direct current converter circuit 402a of the first series-in-parallel-out rectifier circuit provides one or more voltage signals to the first plurality of direct current-to-direct current converter circuits 404a via one or more child buses. Additionally, the second alternating current-to-direct current converter circuit 402b of the second series-in-parallel-out rectifier circuit provides one or more voltage signals to the second plurality of direct current-to-direct current converter circuits via one or more additional child buses.

Furthermore, as illustrated in FIG. 4A, the alternating current-to-direct current converter circuits provide a plurality of voltage signals 413 (e.g., ~500-600 V each) to the direct current-to-direct current converter circuit based on the input voltage signal in parallel. Accordingly, in one or more embodiments, the first alternating current-to-direct current converter circuit 402a provides a plurality of separate voltage signals to the first plurality of direct current-to-direct current converter circuits 404a attached to the anode 406 of the electrodeposition device 400. More specifically, each direct current-to-direct current converter circuit receives a separate, high voltage signal from the first alternating current-to-direct current converter circuit 402a. Additionally, each direct current-to-direct current converter circuit reduces the voltage of the provided high voltage signal to a lower voltage with a controllable output current.

In one or more embodiments, the controllable output current from each direct current-to-direct current converter circuit flows to a cathode of the electrodeposition device 400 via a system of wires or bus bars that form a cathode bus network (illustrated by the lines 415 from the first plurality of direct current-to-direct current converter circuits 404a and the second plurality of direct current-to-direct current converter circuits 404b to the cathode 408). Additionally, the current flows from the cathode 408 through the electrodeposition device 400 (e.g., via an electrolytic bath) to the first plurality of direct current-to-direct current converter circuits 404a and the second plurality of direct current-to-direct current converter circuits 404b via the anode 406. Accordingly, the current generated by each direct current-to-direct current converter circuit flows through a nearly minimum-length path to and through the electrodeposition device 400.

According to one or more embodiments, the electrodeposition system controls the output currents of the direct current-to-direct current converter circuits independently. Specifically, the electrodeposition system controls the amount of current generated by each direct current-to-direct current converter circuit to determine the amount of current sourced through the respective positions of the anode 406. The electrodeposition system can thus fine-tune the current distribution through the electrodeposition device 400 (and via the electrolytic bath to deposit a material on a surface of a cathode 408 of the electrodeposition device 400).

In some embodiments, the first plurality of direct current-to-direct current converter circuits 404a dtrack commands provided over a control interface that connects to each front-end stage of the series-in-parallel-out rectifier circuit (e.g., as indicated as "EDM Controller" in FIG. 4A). For example, each control interface connects to an electrodeposition device controller via a network (e.g., a local area network such as an operations technology network) such that there is no intervening control box or data converter. In one or more embodiments, the control interface includes a 10/100 BASE-T ethernet connection using TCP/IP communications technologies. Additionally, an application layer associated with the controller includes a specific communication protocol for industrial electronic devices over a TCP/IP connection.

According to some embodiments, the currents generated by the direct current-to-direct current converter circuits of the series-in-parallel-out rectifier circuits are positive or negative. For example, the electrodeposition system can cause the first plurality of direct current-to-direct current converter circuits 404a and the second plurality of direct current-to-direct current converter circuits 404b to generate bipolar current output. FIG. 4A illustrates current levels at the different connections and lines. To illustrate, the front-end stages can generate 130-160 A current lines, which are then split into 8-10 A current lines to each of the direct current-to-direct current converter circuits.

As mentioned, FIG. 4A illustrates that the first plurality of direct current-to-direct current converter circuits 404a and the second plurality of direct current-to-direct current converter circuits 404b have inputs connected to the first alternating current-to-direct current converter circuit 402a and the second alternating current-to-direct current converter circuit 402b, respectively, in parallel. For example, the electrodeposition system feeds each direct current-to-direct current converter circuit with a pair of electrical connections (e.g., cables or wires) from the corresponding front-end stage, which results in relatively low currents flowing to each direct current-to-direct current converter circuit. Alternatively, the electrodeposition system can utilize a bus cable to join all direct current-to-direct current converter circuits to the corresponding front-end stage, rather than utilizing individual wire pairs for each direct current-to-direct current converter circuit.

By utilizing parallel inputs to the direct current-to-direct current converter circuits of the back-end stages in each of the series-in-parallel-out rectifier circuits, the electrodeposition system is not limited to an inherent minimum/maximum number of direct current-to-direct current converter circuits. Thus, for example, each series-in-parallel-out rectifier circuit can include Additionally, the parallel connections provide improved fault tolerance for the series-in-parallel-out rectifier circuit. In some instances, the parallel connections also allow the direct current-to-direct current converter circuits in each rectifier circuit to operate without regulating their own input voltage. In some embodiments, the electrodeposition system can cause the direct current-to-direct current converter circuits to fully step the voltage down from the bus to the load, and thus may include higher voltage semiconductors in each direct current-to-direct current converter circuit. To mitigate disadvantages of high input voltage, the electrodeposition system can cause the front-end stage to produce a lower voltage.

FIG. 4A illustrates that a single side of the electrodeposition device 400 includes two separate series-in-parallel-out rectifier circuits, such that the electrodeposition device 400 has four separate series-in-parallel-out rectifier circuits (two on each side). Accordingly, the electrodeposition system has a total of 4×16 total direct current-to-direct current converter circuits attached to different portions of the anode of the electrodeposition device 400 (i.e., 16 direct current-to-direct current converter circuits for each series-in-parallel-out rectifier circuit). In other embodiments, the electrodeposition device 400 includes more or fewer series-in-parallel-out rectifier circuits. Furthermore, each series-in-parallel-out rectifier circuit may have more or fewer direct current-to-direct current converter circuits.

Figure 4B:
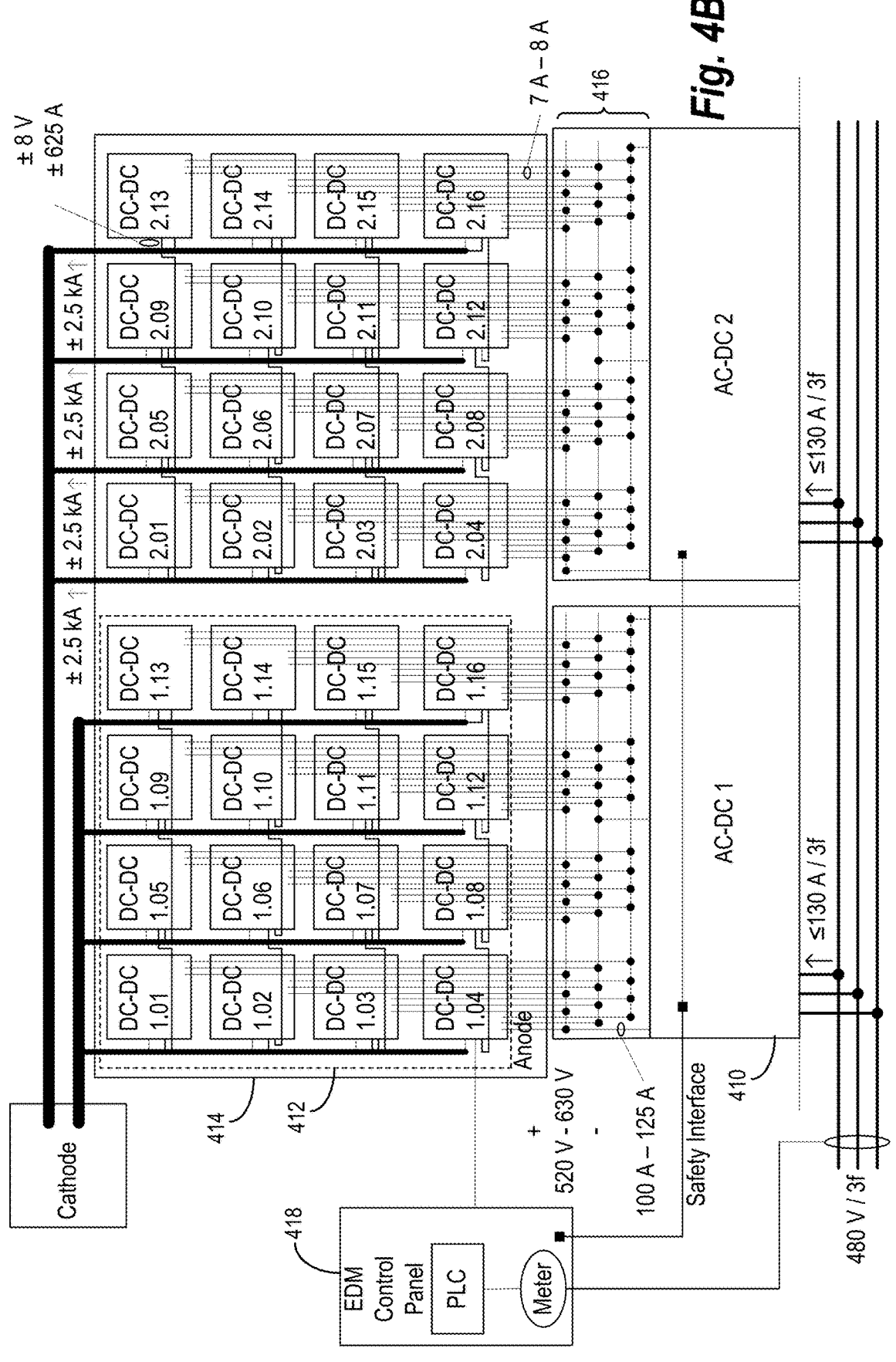

FIG. 4B illustrates an additional embodiment of an electrodeposition device. Specifically, the electrodeposition device includes a plurality of series-in-parallel-out rectifier circuits. For example, the electrodeposition device includes a first series-in-parallel-out rectifier circuit, which includes a front-end stage with an alternating current-to-direct current converter circuit 410 and a back-end stage with a plurality of direct current-to-direct current converter circuits 412 generating parallel outputs. Additionally, the direct current-to-direct current converter circuits 412 are mounted on an anode 414 of the electrodeposition device.

As illustrated in FIG. 4B, the alternating current-to-direct current converter circuit 410 is connected to the direct current-to-direct current converter circuits 412 via a plurality of electrical connections 416. For instance, the alternating current-to-direct current converter circuit 410 is connected to the direct current-to-direct current converter circuits 412 via three separate electrical connections 416 to each direct current-to-direct current converter circuit, as shown. In one or more embodiments, the alternating current-to-direct current converter circuit divides the input voltage signal into two separate signals of approximately equal voltage (e.g., 260 V). The alternating current-to-direct current converter circuit 410 provides two copies of the same voltage signal to each direct current-to-direct current converter circuit on two separate lines. The separate electrical connections 416 can include two voltages of equal (e.g., within a threshold tolerance) voltages on two lines and a midpoint line. Accordingly, the electrodeposition device of FIG. 4B lowers the initial voltage of each signal provided to each direct current-to-direct current converter circuit via the two voltages with the midpoint line relative to the electrodeposition device 400 of FIG. 4A.

In one or more additional embodiments, as illustrated in FIG. 4B, the electrodeposition device includes a controller 418 separate from the front-end stage. For example, instead of controlling the currents/voltages output by the direct current-to-direct current converter circuits 412 via the alternating current-to-direct current converter circuit 410 of the front-end stage, the electrodeposition device utilizes the controller 418 to directly control the currents/voltages produced by the direct current-to-direct current converter circuits 412. Accordingly, the controller 418 can include electrical connections to each of the direct current-to-direct current converter circuits 412 to manage the current applied to each location of the anode 414 (e.g., to apply the same or similar currents and/or to apply different currents, as may serve a particular implementation). In one or more embodiments, the electrodeposition device includes a single controller to control currents/voltages output by the back-end stages of a plurality of rectifier circuits or separate controllers to control current voltages for each of the back-end stages of the rectifier circuits.

Figure 5:
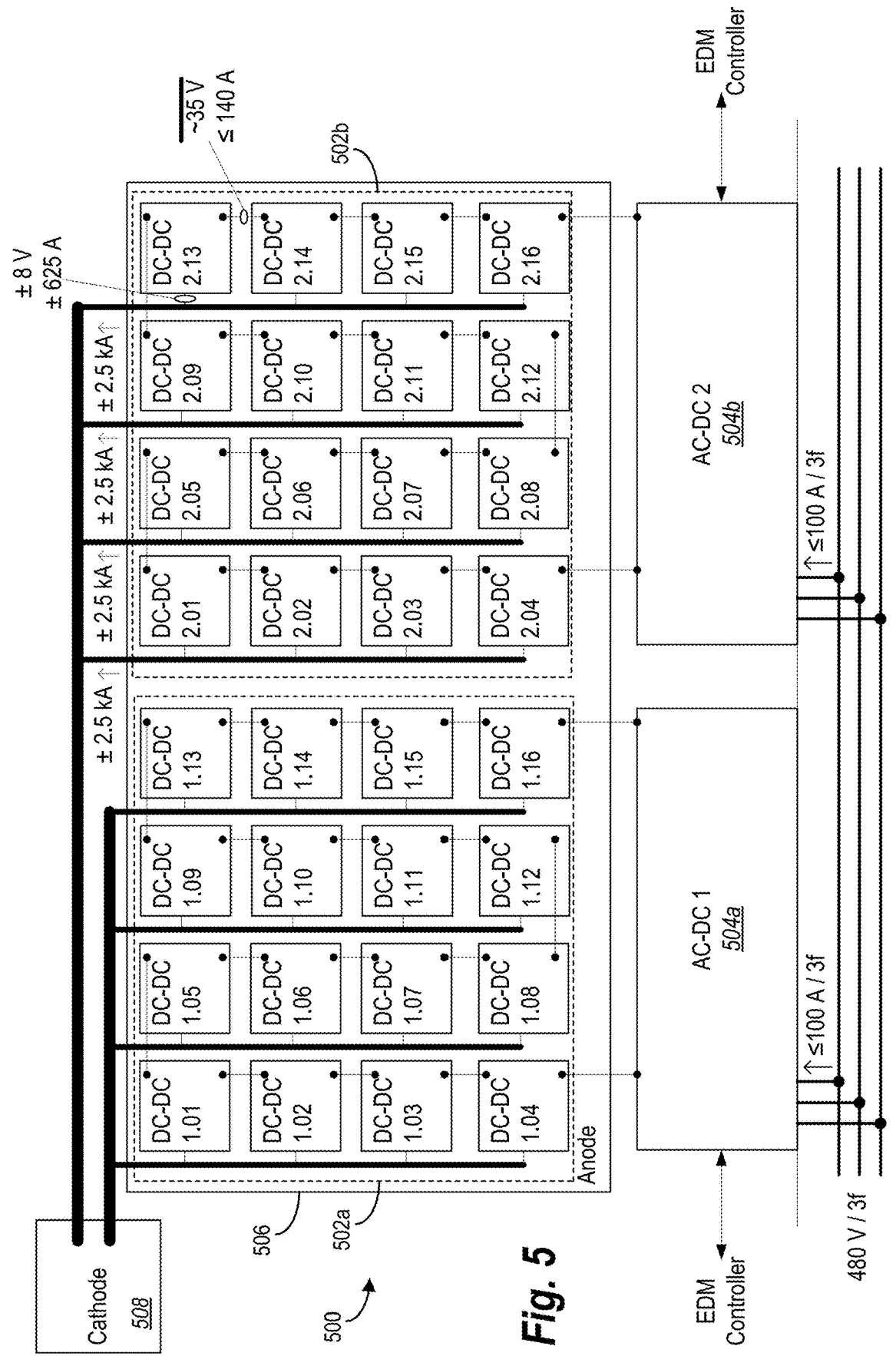
FIG. 5 illustrates a block diagram of an electrodeposition device including a rectifier circuit in accordance with one or more implementations.

FIG. 5 illustrates an alternative embodiment of an electrodeposition device 500. In particular, FIG. 5 illustrates that electrodeposition device 500 includes a first series-in-parallel-out rectifier circuit including first direct current-to-direct current converter circuits 502a connected in series (e.g., in a daisy chain) to a first alternating current-to-direct current converter circuit 504a, rather than in parallel (e.g., as in FIG. 4A). The series direct current-to-direct current converter circuits generate parallel outputs. In such an embodiment, by connecting the first direct current-to-direct current converter circuits 502a in series, the electrodeposition system can use shorter cables (or smaller bus bar(s)) to connect the first alternating current-to-direct current converter circuit 504a to the first direct current-to-direct current converter circuits 502a. The electrodeposition system can also reduce the number of connecters from the front-end stage to the back-end stage.

Furthermore, the number of direct current-to-direct current converter circuits in such an implementation is not fixed by the front-end stage. For example, rather than having 16 direct current-to-direct current converter circuits in a given rectifier device, as illustrated in FIG. 4B, an electrodeposition device can include more or fewer than 16 direct current-to-direct current converter circuits in a rectifier circuit. Furthermore, the direct current-to-direct current converter circuits can each have larger or smaller sizes than depicted herein to apply their corresponding currents to larger or smaller areas of an anode 506. Additionally, by connecting the direct current-to-direct current converter circuit converter circuits 502 in series, the electrodeposition device 500 provides a lower voltage to each individual direct current-to-direct current converter circuit.

As further illustrated in FIG. 5, the electrodeposition device 500 includes a second series-in-parallel-out rectifier circuit including second direct current-to-direct current converter circuits 502b and a second alternating current-to-direct current converter circuit 504b. In particular, the second direct current-to-direct current converter circuits 502b are connected to the second alternating current-to-direct current converter circuit 504b in series. The second direct current-to-direct current converter circuits 502b can convert the single signal from the second alternating current-to-direct current converter circuit 504b to a plurality of child direct current signals in parallel. Thus, the first direct current-to-direct current converter circuits 502a and the second direct current-to-direct current converter circuits 502b provide a plurality of parallel currents to the anode 506 and through an anode bath to a cathode 508 of the electrodeposition device 500.

Figure 6:
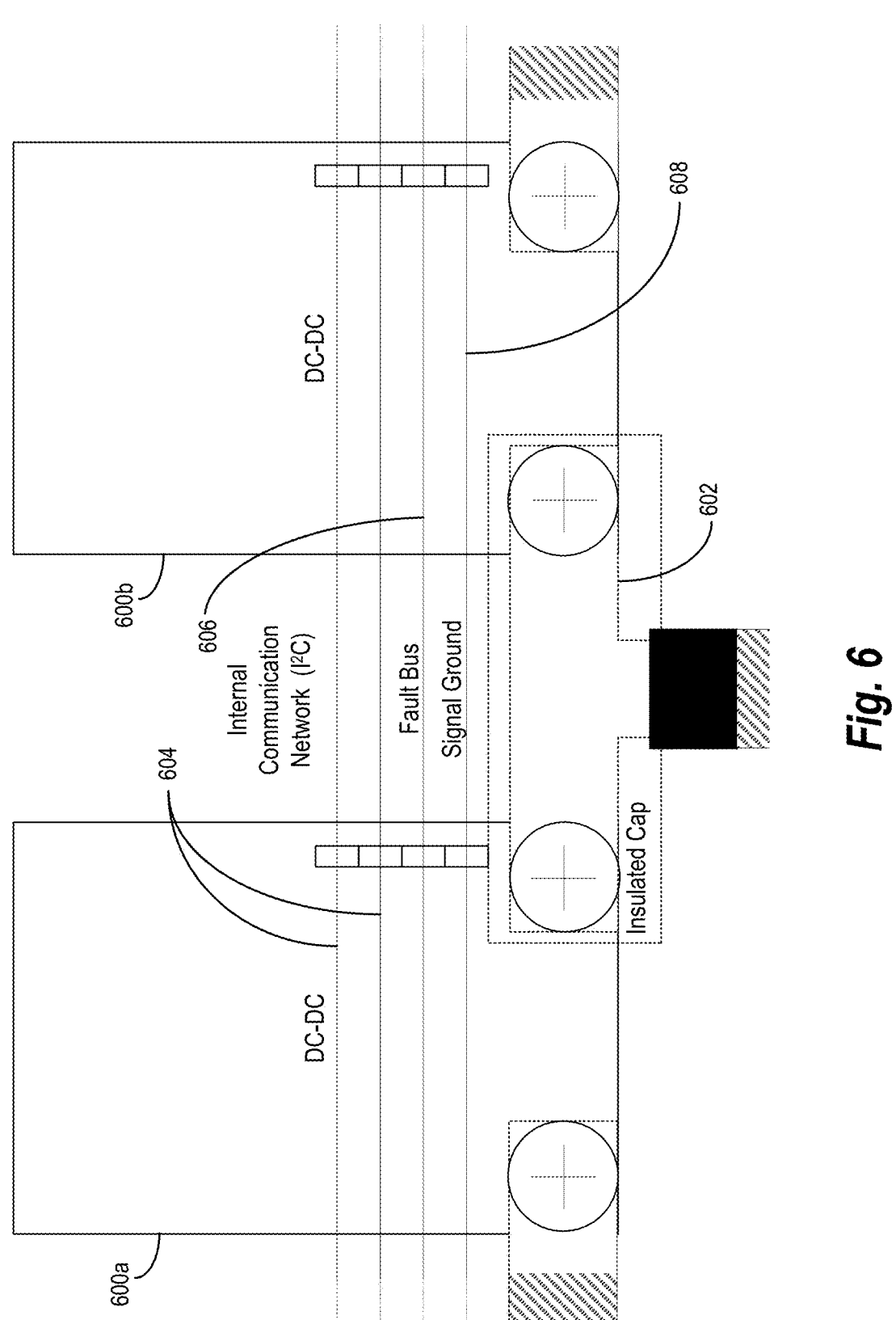
FIG. 6 illustrates a block diagram of a communications connection for converter circuits of a rectifier circuit in accordance with one or more implementations.

FIG. 6 illustrates a close-up view of a power and communications connection for direct current-to-direct current converter circuits in a series-in-parallel-out rectifier circuit. Specifically, as shown in FIG. 6, each direct current-to-direct current converter circuit includes a plurality of connections to a plurality of signals for communications, fault, ground, and input current/voltage signals. For example, FIG. 6 illustrates that adjacent child buses for separate direct current-to-direct current converter circuits (e.g., a first direct current-to-direct current converter circuit 600a and a second direct current-to-direct current converter circuit 600b) share a conductor 602. While pairs of conductors are shown for each direct current-to-direct current converter circuit, the positive of a direct current-to-direct current converter circuit has the same potential as the negative of an adjacent direct current-to-direct current converter circuit. In addition to reducing the number of conductors, due to each direct current-to-direct current converter circuit carrying approximately the same current, the conductor 602 carries approximately zero current, which reduces losses. In some embodiments, the electrodeposition system sizes each conductor for full current to account for fault conditions and corner cases that result in adjacent direct current-to-direct current converter circuits carrying substantially different currents.

In one or more embodiments, as illustrated in FIG. 6, the electrodeposition system connects a group of communication wires 604 in a daisy chain fashion between direct current-to-direct current converter circuits. For instance, FIG. 6 illustrates an internal communication network including two wires (e.g., an I²C bus) that provides a protocol for communications between a controller and each direct current-to-direct current converter circuit according to the specific hardware/software configuration. Thus, the controller can send signals to one or more direct current-to-direct current converter circuits (e.g., the first direct current-to-direct current converter circuit 600a and/or the second direct current-to-direct current converter circuit 600b) via the communication wires 604. In some embodiments, the communications method includes a controller area network, power line carrier communication over the child bus lines, or other forms of wired communication.

FIG. 6 also illustrates a fault bus 606 for providing fault detection for the direct current-to-direct current converter circuits. The fault bus 606 can provide an indication to a controller of a fault in connection with the operation of one or more direct current-to-direct current converter circuits. In response to a fault signal via the fault bus 606 indicating failure or incorrect operation of a particular direct current-to-direct current converter circuit, the controller can send one or more signals via the communication wires 604 to cause one or more direct current-to-direct current converter circuits to stop generating outputs, to increase their outputs (e.g., to apply more current to a given area of an anode surface), or to otherwise modify the operation of the direct current-to-direct current converter circuit(s).

In one or more embodiments, the electrodeposition system incorporates the fault bus into the internal communication network. Alternatively, if using a single wire, the electrodeposition system can provide a hardware solution such as an open collector output on a front-end stage for each direct current-to-direct current converter circuit to use to rapidly signal a fault to other devices. FIG. 6 also illustrates a signal ground 608 for grounding the direct current-to-direct current converter circuits.

FIG. 6 illustrates a power and communications connection in connection with an embodiment of an electrodeposition device in which cables connect the front-end stage to each brick component (e.g., a plurality of parallel connections between the front-end stage and direct current-to-direct current converter circuits of the back end-stage). In alternative embodiments involving a daisy chain/series connection of direct current-to-direct current converter circuits in a back-end stage, the electrodeposition system can omit a connecting cable back to the front-end stage (e.g., the buses sharing the conductor 602) while keeping the brick-to-brick connection between adjacent direct current-to-direct current converter circuits (e.g., for controller signals and signals from the front-end stage).

Figure 7A:
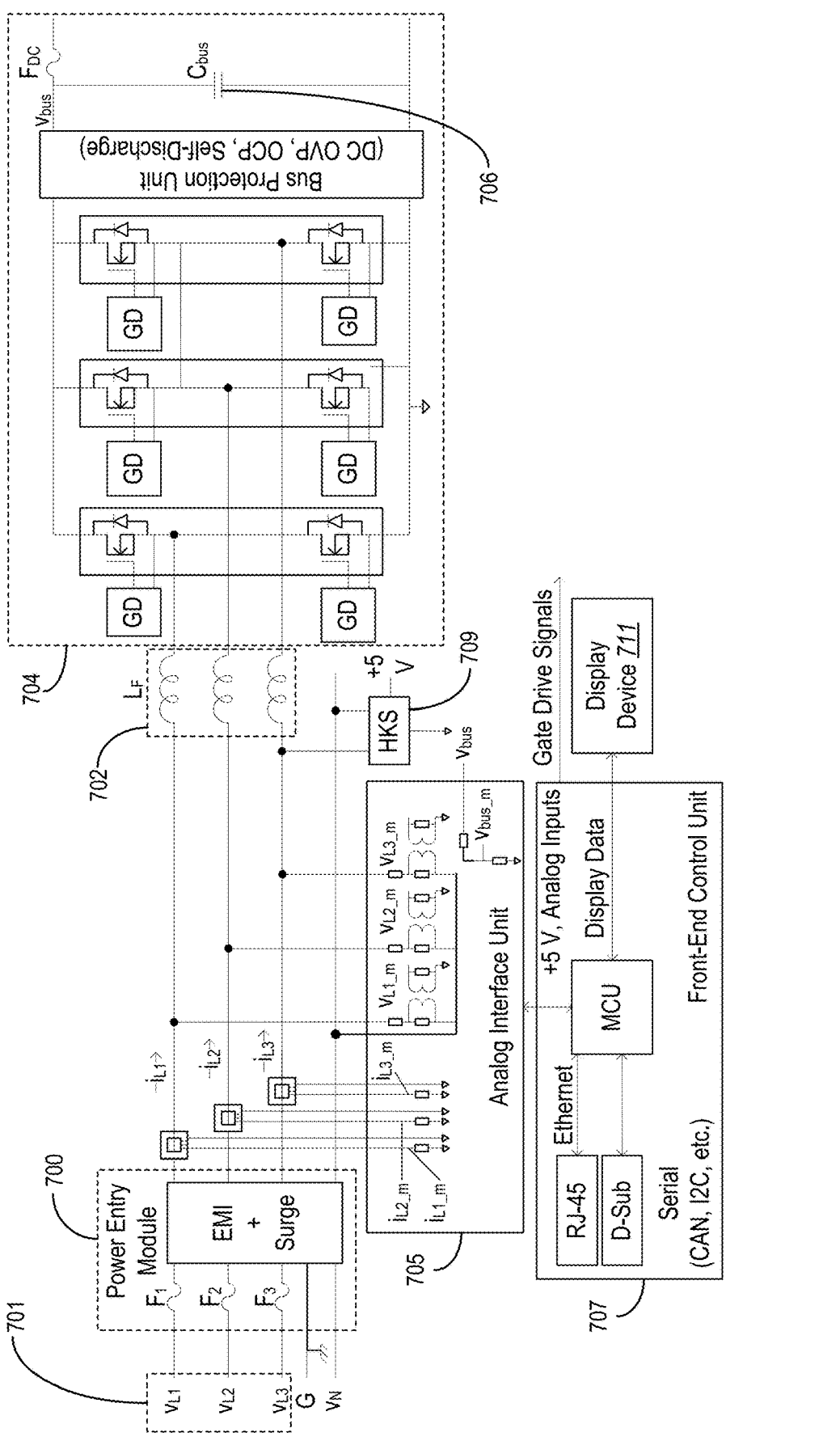
FIGS. 7A-7D illustrate schematic diagrams of a front-end stage in a rectifier circuit in accordance with one or more implementations.

FIGS. 7A-7D illustrate embodiments of a front-end stage of a series-in-parallel-out rectifier circuit. Specifically, FIG. 7A illustrates a front-end stage including an alternating current-to-direct current converter circuit that receives a three-phase voltage signal 701 with alternating current (e.g., a 277/480 line voltage) and generates an output voltage signal of ~500 V-600 V with direct current, depending on load and line conditions. For example, the alternating current-to-direct current converter includes a power entry module 700 including overcurrent protection (e.g., fuses), electromagnetic interference ("EMI") filtering, and surge protection.

FIG. 7A further illustrates that power flows from the power entry module 700 through filter inductors 702, "L$_F$", to a synchronous rectifier ("SR") 704. According to one or more embodiments, the filter inductors 702 reduce total harmonic distortion of the three-phase voltage signal 701 and increase the power factor (e.g., relative to a conventional rectifier). In one or more embodiments, the filter inductors 702 include three separate cores. In alternative embodiments, the filter inductors 702 are joined on a common core.

The synchronous rectifier 704 can include high-voltage switches, such as silicon carbide metal-oxide-semiconductor field-effect transistors ("MOSFETs"), which switch at the line frequency. In one or more embodiments, the MOSFETS reduce voltage drop that can occur across the diodes. In one or more embodiments, the synchronous rectifier 704 is not an "active rectifier" due to not providing power factor correction or regulation. Furthermore, the negative terminal of the synchronous rectifier 704 can be "common"—i.e., the voltage reference for analog and digital circuitry in the rectifier circuit (e.g., for the direct current-to-direct current converter circuits in the back-end stage of the rectifier circuit).

As illustrated, the output of the synchronous rectifier 704 includes a bus capacitor 706, C$_{bus}$. For example, the bus capacitor 706 provides bulk filtering for a bus voltage, $v_{bus}$. In one or more embodiments, the electrodeposition system drive the MOSFETS of the synchronous rectifier 704 by using gate drive units ("GDUs" or "GDs" as illustrated in FIG. 7A). For example, the GDUs sense the MOSFET voltage/current to determine when to switch from driving current through one MOSFET to another to minimize losses without jeopardizing reliability (e.g., avoiding shoot-through or overtemperature).

Although FIG. 7A illustrates a synchronous rectifier 704 including GDUs with MOSFETS to convert alternating current to direct current, in alternative embodiments, the synchronous rectifier 704 includes more, fewer, or different components. For example, the synchronous rectifier 704 can include other types of transistors, such as, but not limited to, GaN transistors, insulated-gate bipolar transistors, or bipolar junction transistors. Furthermore, in some embodiments, the front-end stage includes a half wave rectifier, a full wave rectifier, a bridge rectifier, or other types of rectifier circuits. Accordingly, the electrodeposition system can utilize one or more types of circuits in a front-end stage of a series-in-parallel-out rectifier circuit to convert an alternating current signal to one or more direct current signals to provide to a back-end stage.

Figure 7B:
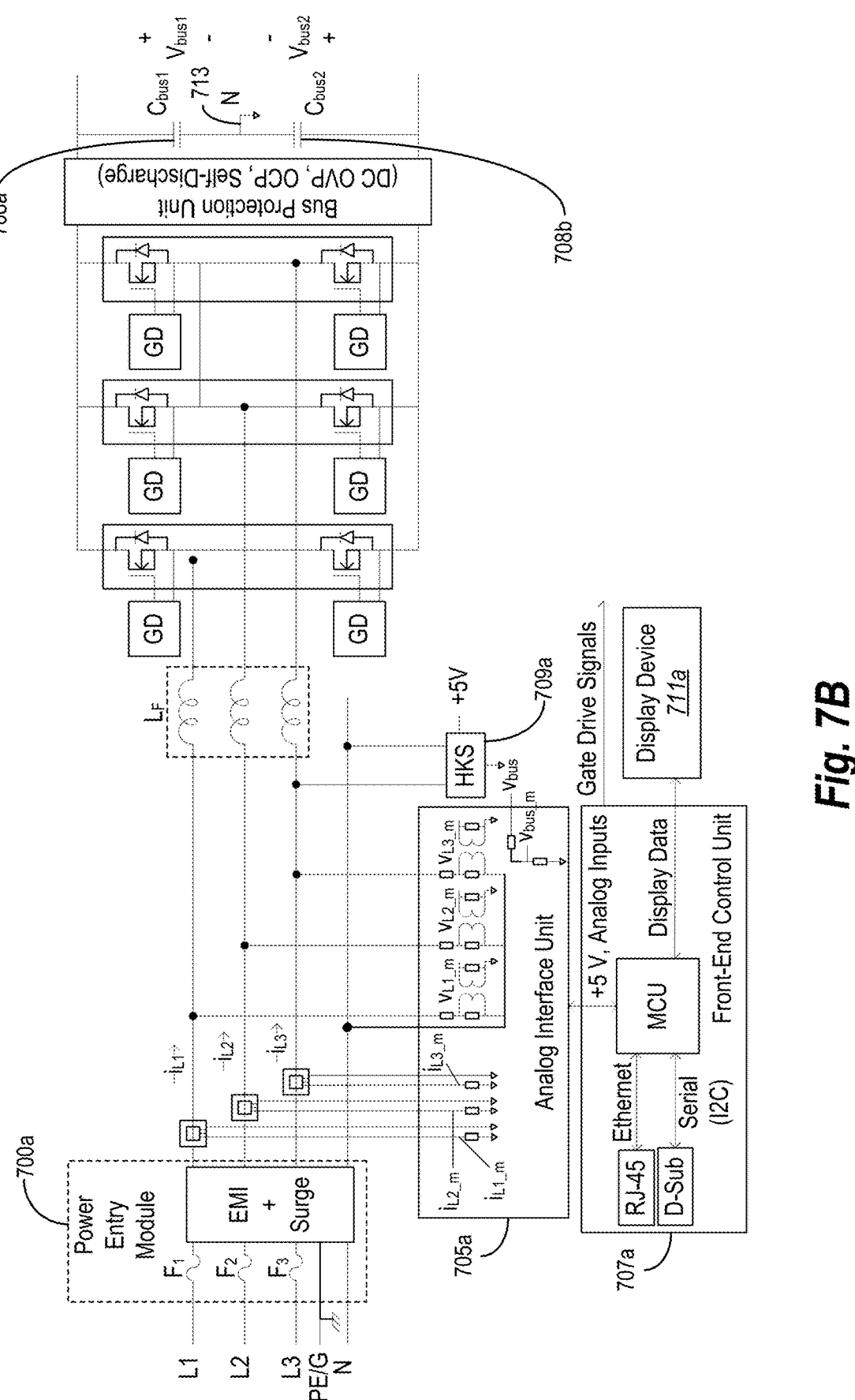
Figure 7C:
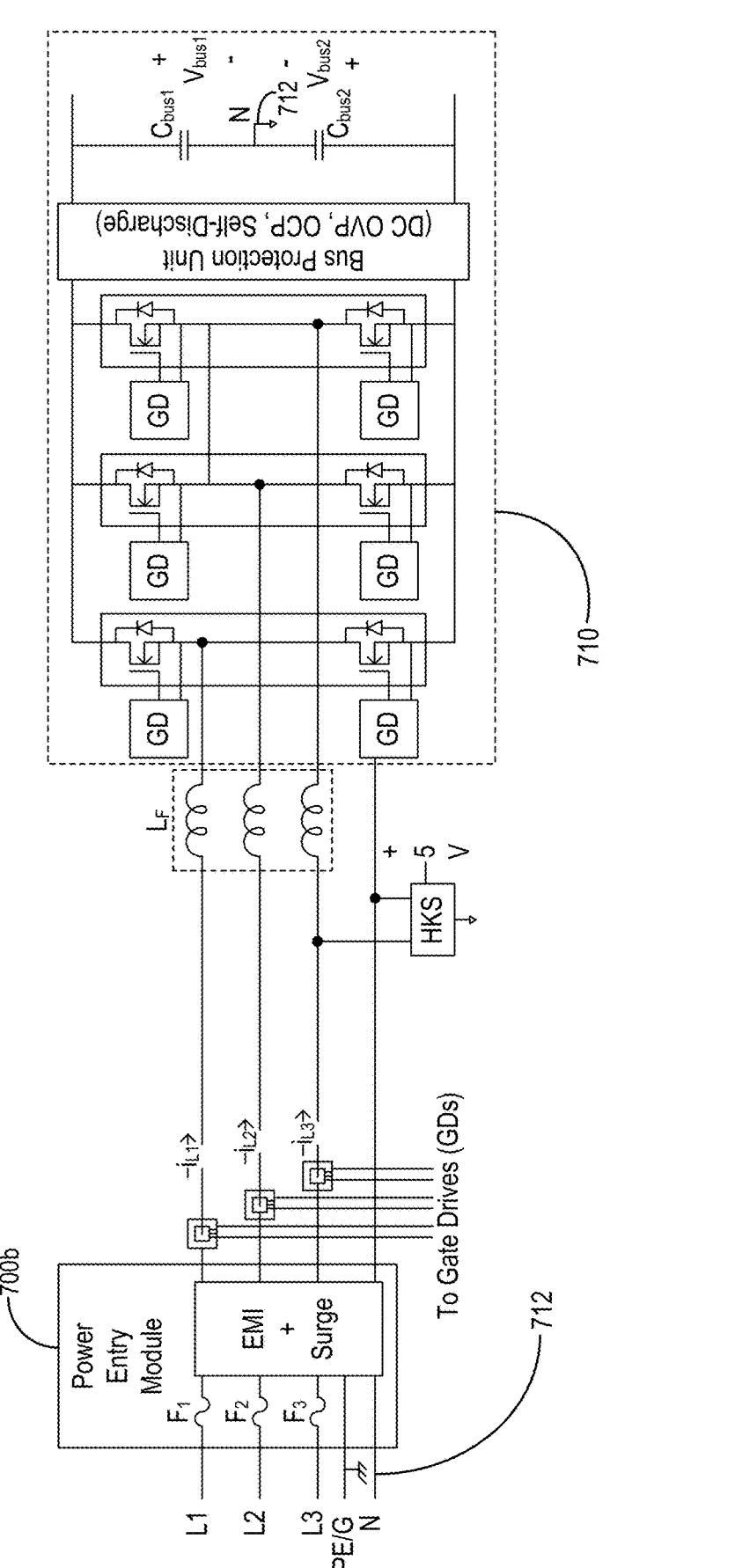
Figure 7D:
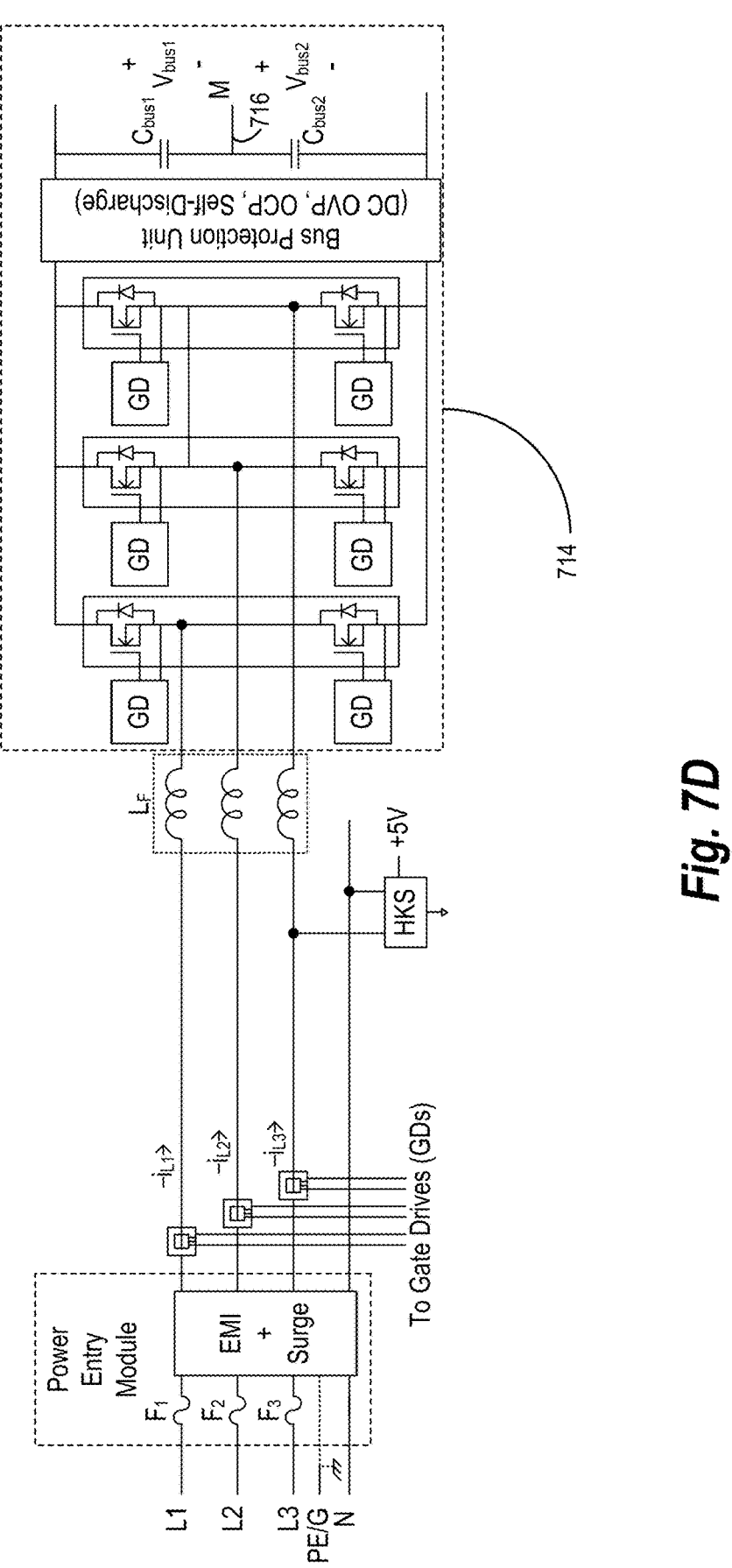

Furthermore, in one or more embodiments, the electrodeposition system utilizes the front-end stage including the alternating current-to-direct current converter circuit of FIG. 7A to generate one or more output voltage signals (e.g., the bus voltage of FIG. 7A and/or one or more additional output voltage signals as illustrated in FIGS. 7B-7D). For example, the front-end stage generates a plurality of separate voltage signals at the output to provide to a plurality of separate brick components in parallel. In some embodiments, the front-end stage generates two similar or equal output voltage signals (e.g., within a threshold voltage) to reduce the overall voltage values of signals provided to a back-end stage. Alternatively, the front-end stage generates a single voltage that the electrodeposition system utilizes to convert to a plurality of parallel output voltages via a plurality of separate brick components in series (e.g., daisy-chained).

According to one or more embodiments, the electrodeposition system protects a bus voltage $v_{bus}$ of the front-end stage by utilizing a Bus Protection Unit ("BPU"). The BPU can provide overvoltage, overcurrent, and self-discharge capability. In particular, when a front-end stage is unpowered, the BPU causes the bus voltage $v_{bus}$ to reduce to a safe voltage (e.g., below a threshold) within a predetermined amount of time. The BPU also prevents the bus voltage $v_{bus}$ from exceeding a threshold for safety and meeting component reliability specifications. The BPU can also include overcurrent protection such as a fuse or a feedback mechanism that causes the front-end stage to curtail or shut down.

In one or more embodiments, the front-end stage includes an Analog Interface Unit 705 ("AIU") that provides appropriate isolated signals for control. The electrodeposition system may sense high voltage alternating current and direct current signals and make the signals available for sampling by a Front-End Control Unit ("FECU") 707. The electrodeposition system can generate voltage signals from voltage dividers and isolation transformers and current signals from current transformers. In one or more embodiments, the electrodeposition system does not measure bus current, $I_B$, explicitly, though in alternative embodiments, the electrodeposition system measures the bus current with a shunt resistance or other DC-rated sensor. The electrodeposition system can reconstruct the bus current from the alternating current measurements using an analog circuit and/or software calculations. In one or more additional embodiments, the front-end stage includes a housekeeping supply 709 ("HKS") to provide isolated power for the FECU and GDUs.

In one or more embodiments, the electrodeposition system utilizes the FECU 707 as a controller/computing device to control the front-end stage and brick components of a series-in-parallel-out rectifier circuit. According to one or more embodiments, the FECU 707 includes a microcontroller unit ("MCU") and communication interfaces connected to an electrodeposition device controller (e.g., via the network with TCP/IP with a specific protocol) and to the brick components in the back-end stages via a two-wire communication method (e.g., I²C). The FECU 707 can also provide a user interface, including indicator lights and/or a graphical display to display specific data via a display device 711. The FECU 707 can communicate data to the electrodeposition device controller, which may also connected to other control panels and human machine interfaces. Furthermore, the FECU 707 can deliver switching signals (e.g., "gate drive signals") to the GDUs with switching signals being determined by the system state and measured currents and/or voltages.

In one or more embodiments one or more of the computing devices and/or controllers in the electrodeposition system include computing devices as described in more detail below with respect to FIG. 18. Furthermore, in one or more embodiments, the components of the front-end stage in FIG. 7A are combined on one or more circuit boards or separated into a plurality of different circuit boards.

FIG. 7B illustrates an alternative embodiment of a front-end stage of a series-in-parallel-out rectifier circuit. Specifically, FIG. 7B illustrates that the front-end stage includes a split bus (e.g., two halves with approximately equal voltage) with two bus capacitors (i.e., a first bus capacitor 708a and a second bus capacitor 708b). In addition, as illustrated in FIG. 7B, the center point of the split bus is connected to neutral (e.g., via a neutral line 713). Furthermore, in the embodiment of FIG. 7B, the front-end stage also includes a power entry module 700a, AIU 705a, FECU 707a, HKS 709a, and display device 711a to provide additional controls and capabilities as described in connection with FIG. 7A.

In one or more embodiments, the front-end stage of FIG. 7B provides a lower bus voltage to deliver to brick components via the split bus, thereby reducing the amount of voltage that each brick component of the back-end stage receives and reduces. In some embodiments, providing a lower voltage to the In one or more embodiments, the electrodeposition system ties the neutral line 713 to common to establish a reference voltage for the control circuits and potentially eliminate or reduce the need for isolation of the bus voltages. According to one or more embodiments, the architecture of FIG. 7B reduces distortion in line currents via the use of the split bus.

FIG. 7C illustrates an additional embodiment of a front-end stage of a series-in-parallel-out rectifier circuit including an alternative configuration of a synchronous rectifier 710. In particular, FIG. 7C illustrates that the synchronous rectifier 710 includes a split bus including a plurality of bus capacitors (e.g., similar to FIG. 7B), with the split bus connected to a neutral line 712. As illustrated in FIG. 7C, the neutral line 712 can connect to a midpoint of the split bus (e.g., between two bus capacitors) and to one or more additional components (e.g., via a power entry module 700b).

Additionally, in contrast to the front-end stages of FIGS. 7A-7B, the front-end stage of FIG. 7C does not include a controller. In one or more embodiments, the electrodeposition system utilizes the front-end stage of FIG. 7C in connection with the electrodeposition device of FIG. 4B, such that the electrodeposition system controls the direct current-to-direct current converter circuits individually, rather than controlling the rectifier circuit via the front-end stage. In some embodiments, the electrodeposition system includes a controller that controls both the front-end stage and the back-end stage. In alternative embodiments, the electrodeposition system includes separate controllers for the front-end stage and the back-end stage. Thus, the front-end stage of FIG. 7C can alternatively include an AIU, FECU, etc.

FIG. 7D illustrates an additional embodiment of a front-end stage of a series-in-parallel-out rectifier circuit including a synchronous rectifier 714. As illustrated in FIG. 7D, the synchronous rectifier 714 divides a bus output to a midpoint line 716, rather than a neutral line. Accordingly, the electrodeposition system can utilize the front-end stage of FIG. 7D to provide a plurality of separate voltages to direct current-to-direct current converter circuits that receive two or more input signals. For example, the electrodeposition system provides the separate bus voltages and the midpoint line 716 to the direct current-to-direct current converter circuits 412 of FIG. 4B for the direct current-to-direct current converter circuits 412 to use in generating a plurality of output signals in parallel. Although FIG. 7D illustrates a front-end stage without a dedicated controller, the front-end stage including the midpoint line 716 at the bus output can include an AIU, FECU, etc.

Figure 8A:
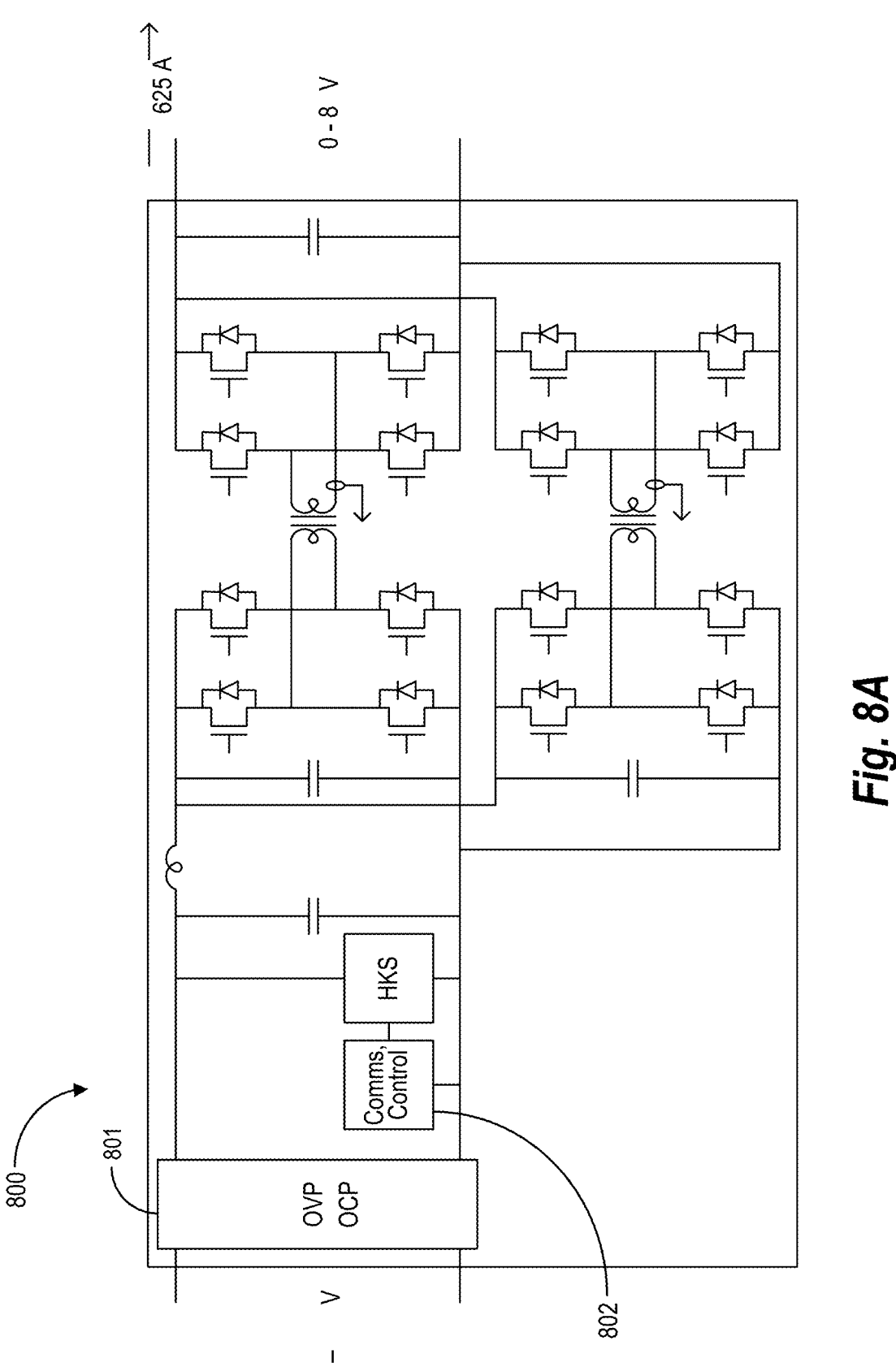
FIGS. 8A-8E illustrate schematic diagrams of various embodiments of a back-end stage in a rectifier circuit in accordance with one or more implementations.

FIG. 8A illustrates an embodiment of a direct current-to-direct current converter circuit 800. Specifically, FIG. 8A illustrates that the direct current-to-direct current converter circuit 800 includes a dual active bridge that converts an input voltage (e.g., ~30-35 V) to a reduced voltage (e.g., ~0-8 V). In particular, the input voltage includes a direct current signal generated by a front-end stage (e.g., an alternating current-to-direct current converter circuit), and the output voltage also includes a direct current signal. In additional embodiments, the direct current-to-direct current converter circuit 800 is multiphase and can utilize unipolar or bipolar pulsing. In one or more embodiments, the dual active bridge includes double-diffused MOS transistors including sub-milliohm values. Alternatively, the dual active bridge includes other types of transistors, such as those described previously.

As mentioned, the electrodeposition system can include a plurality of direct current-to-direct current converter circuits by connecting the separate direct current-to-direct current converter circuits in parallel or in series. Furthermore, the direct current-to-direct current converter circuit 800 can include a communications component 802 to allow a controller of the electrodeposition system to control the current output by the direct current-to-direct current converter circuit 800 independently from other direct current-to-direct current converter circuits. In some embodiments, the direct current-to-direct current converter circuit 800 generates low voltage, high current outputs (e.g., 625 A, as shown). In some embodiments, the direct current-to-direct current converter circuit 800 also self-regulates voltages/currents, though in other embodiments, a controller, a front-end stage, or other component can regulate the voltages/currents. As illustrated in FIG. 8A, the direct current-to-direct current converter circuit 800 can also include a protection unit 801 to provide overvoltage protection and/or overcurrent protection.

Figure 8B:
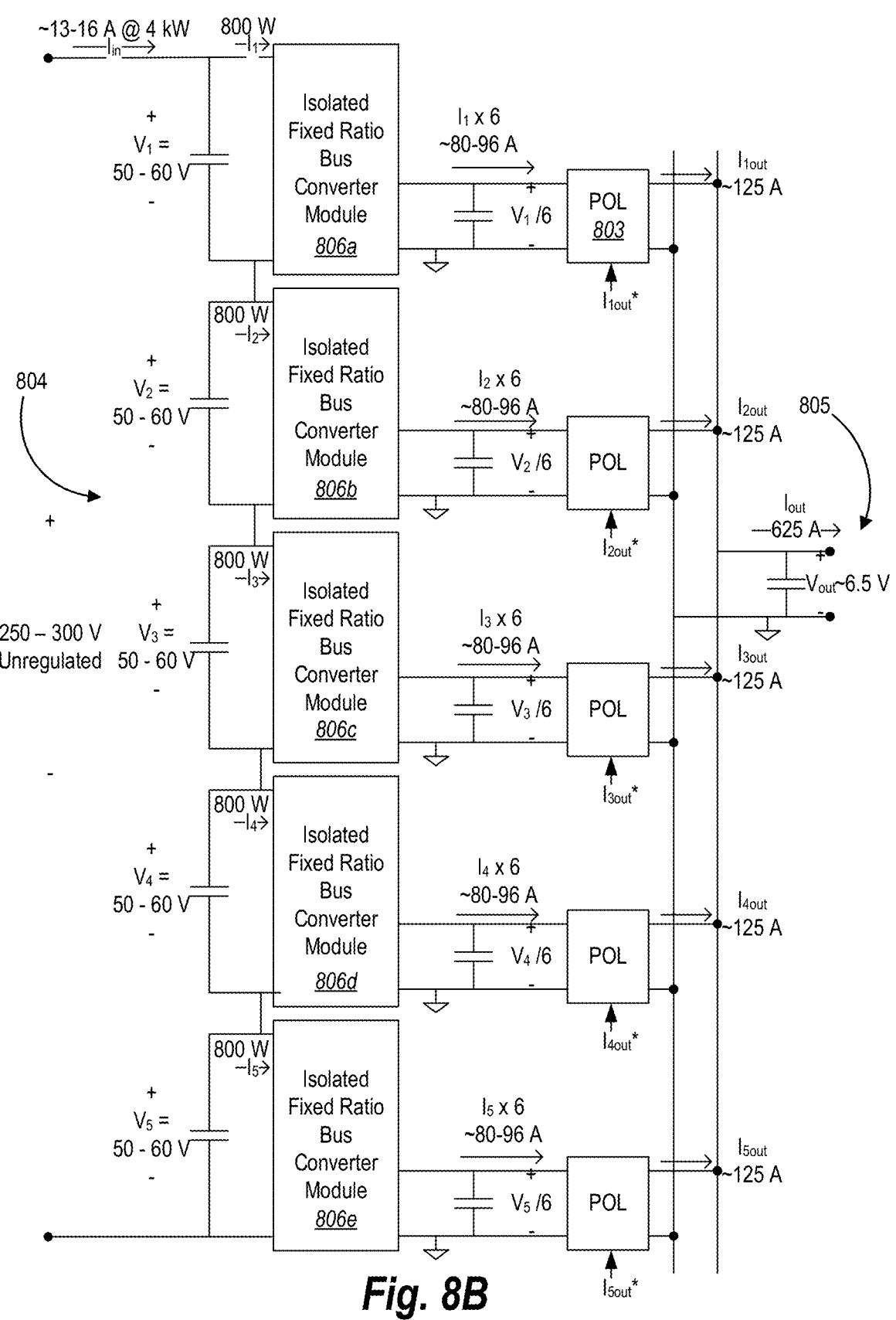

FIG. 8B illustrates an embodiment of a direct current-to-direct current converter circuit 804 of a back-end stage.

Specifically, the direct current-to-direct current converter circuit 804 receives a high voltage, low current input (e.g., a 250-300 V unregulated input with 13-16 A current). To illustrate, the high voltage, low current input is generated by an alternating current-to-direct current converter circuit of a front-end stage. In one or more embodiments, the high voltage, low current input includes a signal split from a high-voltage, high current input a plurality of ways to provide a plurality of high voltage, low current signals to a plurality of direct current-to-direct current converter circuits in a back-end stage.

For example, the direct current-to-direct current converter circuit 804 includes a plurality of separate isolated fixed ratio bus converter modules 806a-806e connected in series that generate a plurality of output voltages from the input signal. To illustrate, the direct current-to-direct current converter circuit 804 provides approximately 50-60 V signals to each of the isolated fixed ratio bus converter modules 806a-806e. Accordingly, the isolated fix ratio bus converter modules 806a-806e of the direct current-to-direct current converter circuit 804 convert a single series input voltage signal to a plurality of separate output voltage signals (e.g., five separate voltage signals).

Additionally, the direct current-to-direct current converter circuit 804 includes a plurality of point of load ("POL") power supplies that step down the voltages generated by the bus converter modules near a load end of the direct current-to-direct current converter circuit 804. For example, a first POL power supply 803 takes a first signal from a first isolated fixed ratio bus converter module 806a and steps up a current of the signal (e.g., from ~80-96 A to 125 A). In one or more embodiments, the POLs each include a synchronous buck POL that controls a voltage with current-limiting control for a given line. The direct current-to-direct current converter circuit 804 thus can combine a plurality of separate signals produced by the isolated fixed ratio bus converter modules 806a-806e and corresponding POL power supplies to generate a final output signal 805 with low voltage and high current (e.g., ~6.5 V, ~625 A). Although FIG. 8B illustrates that the direct current-to-direct current converter module includes five separate isolated fixed ratio bus converter modules, the electrodeposition system can utilize direct current-to-direct current converter circuits with different numbers of isolated fixed ratio bus converter modules.

In one or more embodiments, a controller associated with the direct current-to-direct current converter circuit 804 can monitor the voltages and current signals input and output by the individual components of the direct current-to-direct current converter circuit 804. For instance, the controller can manage the voltages input to each of the bus converter modules and the signals output at the POL power supplies to control the current and/or voltage of the final output signal 805. Thus, the electrodeposition system can utilize the controller to control the current generated by each of the direct current-to-direct current converter circuits in a back-end stage to regulate the current driven through a portion of an anode (and the electrolytic material in an anode bath) of an electrodeposition device.

Figure 8C:
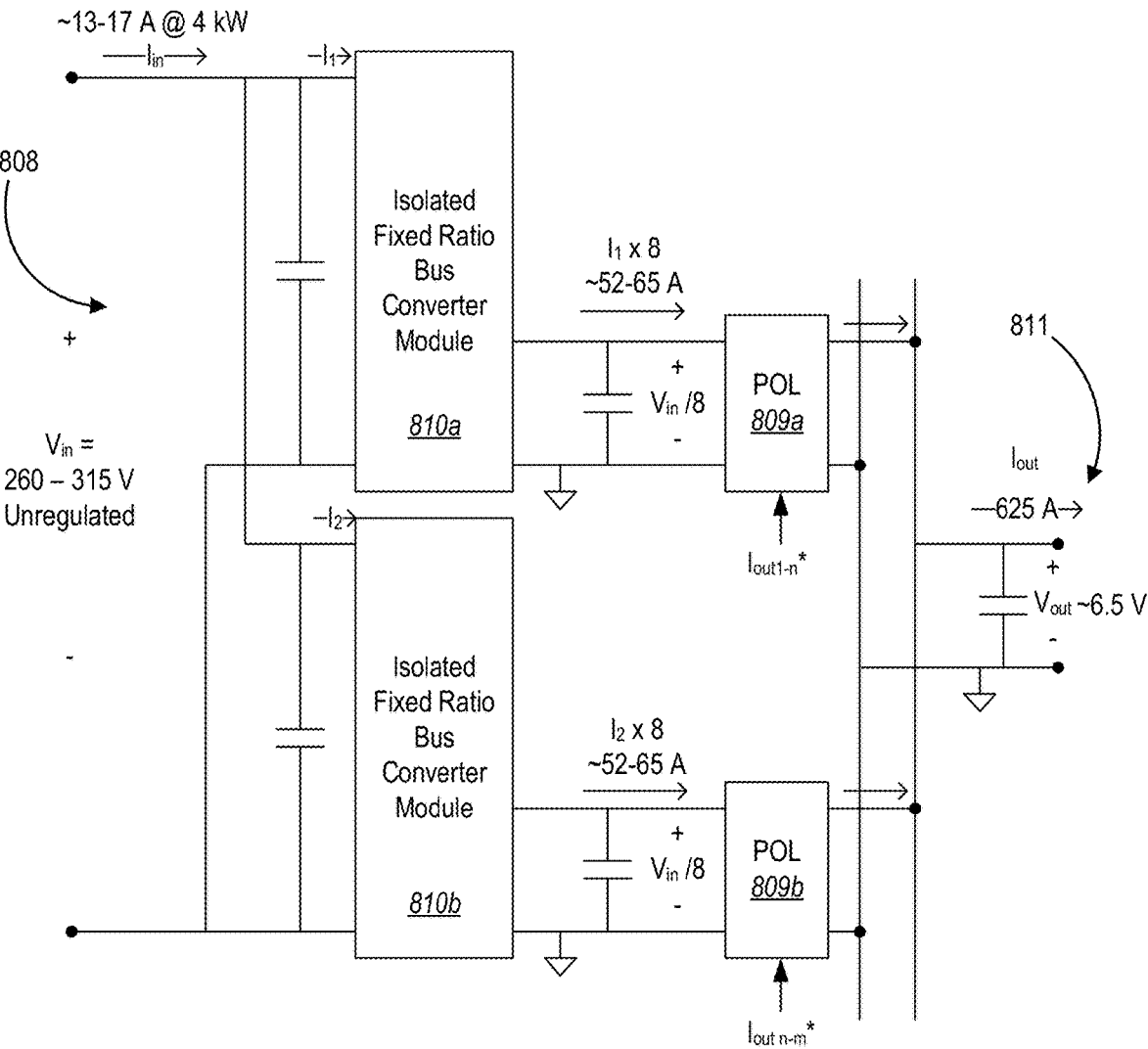

As mentioned, a direct current-to-direct current converter circuit can include a different number of components than the embodiment of FIG. 8B. For example, FIG. 8C illustrates a direct current-to-direct current converter circuit 808 including two isolated fixed ratio bus converter modules 810a-810b. Specifically, the direct current-to-direct current converter circuit 808 of FIG. 8C includes a first isolated fixed ratio bus converter module 810a and a second isolated fixed ratio bus converter module 810*b* based on a single input voltage (e.g., ~260-315 V, ~13-17 A). Additionally, the direct current-to-direct current converter circuit 808 includes POLs 809*a*-809*b* after the isolated fixed ratio bus converter modules 810*a*-810*b* to step down the voltages and generate a final output signal 811. In various embodiments, the electrodeposition system utilizes different components in different embodiments of the direct current-to-direct current converter circuit 808 and/or utilizes a controller to modify functionality of one or more components in the direct current-to-direct current converter circuit 808 to generate different output voltages or currents.

Figure 8D:
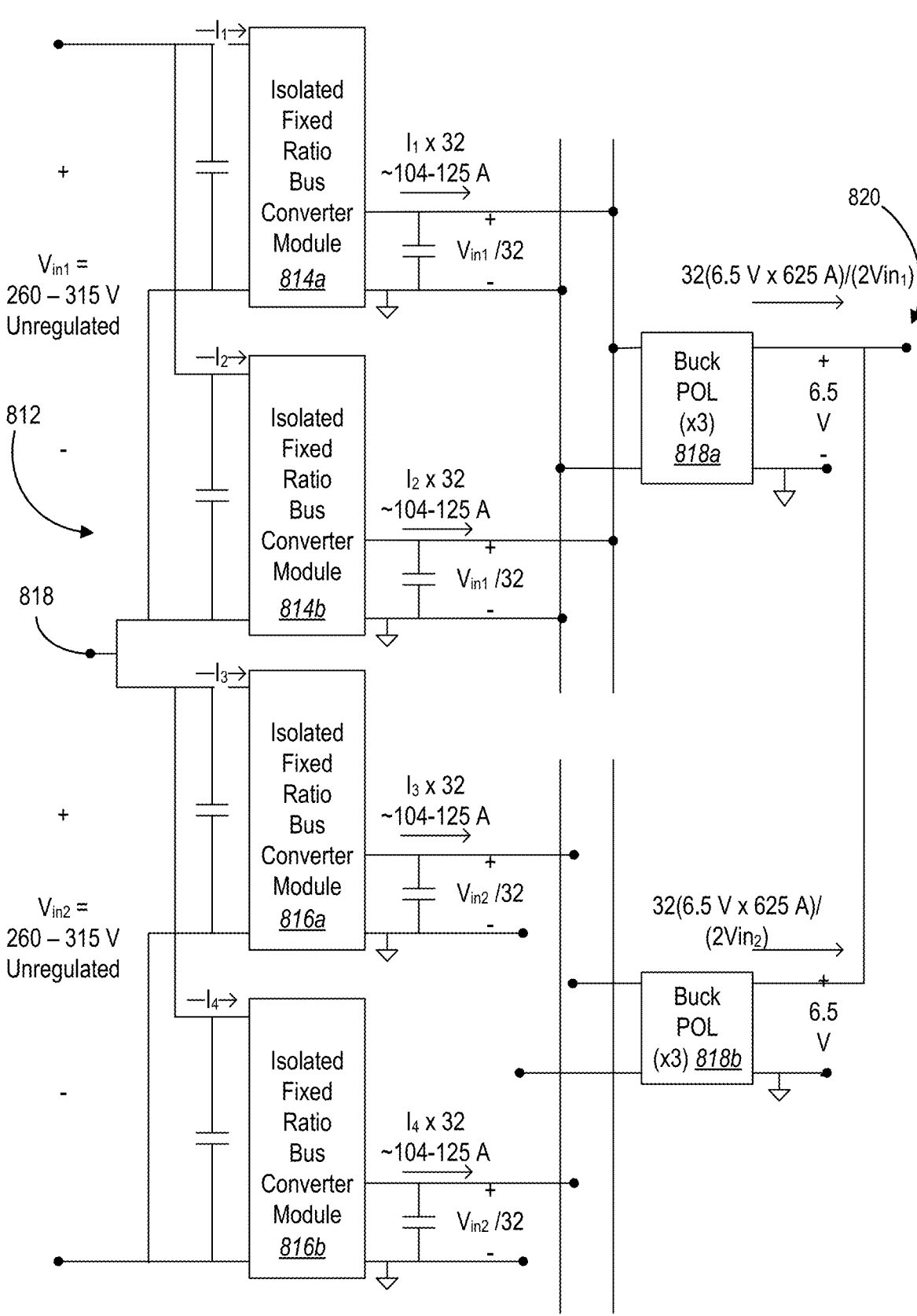

FIG. 8D illustrates an additional embodiment of a direct current-to-direct current converter circuit 812. In particular, the direct current-to-direct current converter circuit 812 of FIG. 8D includes two separate groups of converter modules in parallel. For example, a first group includes a first isolated fixed ratio bus converter module 814*a* and a second isolated fixed ratio bus converter module 814*b*, each outputting a separate signal. Additionally, a second group includes a third isolated fixed ratio bus converter module 816*a* and a fourth isolated fixed ratio bus converter module 816*b*, each outputting a separate signal. Furthermore, as illustrated, the first group and the second group are in parallel.

In one or more embodiments, the direct current-to-direct current converter circuit 812 includes a midpoint line 818. For instance, as previously described (e.g., with respect to FIG. 7D), a front-end stage includes a midpoint line that separates an output signal into two separate copies of an output signal. Accordingly, the direct current-to-direct current converter circuit 812 of FIG. 8D includes the midpoint line 818 to connect to the midpoint line of the front-end stage, thereby providing the separate copies of the output signal to the two groups of converter modules in parallel. The direct current-to-direct current converter circuit 812 of FIG. 8D can thus convert a plurality of separate input voltages provided by a front-end stage of a rectifier circuit into a plurality of separate output voltages. In an alternative embodiment, the direct current-to-direct current converter circuit 812 utilizes a midpoint line based on a neutral line from the front-end stage of the rectifier circuit to configure the parallel branches of the direct current-to-direct current converter circuit 812.

As illustrated in FIG. 8D, the direct current-to-direct current converter circuit 812 includes a set of buck POL power supplies to step down the voltages produced by each of the groups of bus converter modules. For example, a first set of buck POLs 818*a* (e.g., a set of three buck POLs) combines and steps down voltages of the first group of bus converter modules (e.g., the first isolated fixed ratio bus converter module 814*a* and the second isolated fixed ratio bus converter module 814*b*). Additionally, a second set of buck POLs 818*b* combines and steps down voltages of the second group of bus converter modules (e.g., the third isolated fixed ratio bus converter module 816*a* and the fourth isolated fixed ratio bus converter module 816*b*). The direct current-to-direct current converter circuit 812 can further combine the outputs of the sets of buck POLs to generate a final output signal 820. As shown, the final output signal 820 combines the currents produced by the separate parallel branches of the direct current-to-direct current converter circuit 812 at the output voltage of the parallel branches.

Figure 8E:

FIG. 8E illustrates an additional embodiment of a direct current-to-direct current converter circuit 822 includes an EMI filter 824 at an input (e.g., prior to each set of bus converter modules 826*a*-826*b*) to filter any electromagnetic interference from the input signal(s). Additionally, in one or more embodiments, the direct current-to-direct current converter circuit 822 includes a first set of bus converter modules 826*a* and a second set of bus converter modules 826*b* to generate a plurality of parallel outputs to a first set of buck POLs 828*a* and a second set of buck POLs 828*b*, respectively. Furthermore, the direct current-to-direct current converter circuit 822 can include one or more regulators (e.g., a switch regulator and/or a linear regulator) connected to one or more outputs of the sets of bus converter modules to provide voltage regulation for the direct current-to-direct current converter circuit 822. Additionally, the direct current-to-direct current converter circuit 822 generates a final output signal 832 based on the combination of signals generated by the sets of buck POLs.

Furthermore, while FIGS. 8A-8D illustrate specific embodiments of direct current-to-direct current converter circuits with specific configurations of converter modules, the electrodeposition system can utilize other configurations including more or fewer converter modules, and any number of groups of converter modules in parallel with each other within a single direct current-to-direct current converter circuit. Additionally, the electrodeposition system can utilize one or more combinations of front-end stages and/or back-end stages as described herein (e.g., in FIGS. 7A-7D, FIGS. 8A-8E) for a given series-in-parallel-out rectifier circuit, according to the outputs and inputs of each corresponding front-end stage and back-end stage.

Figure 9:
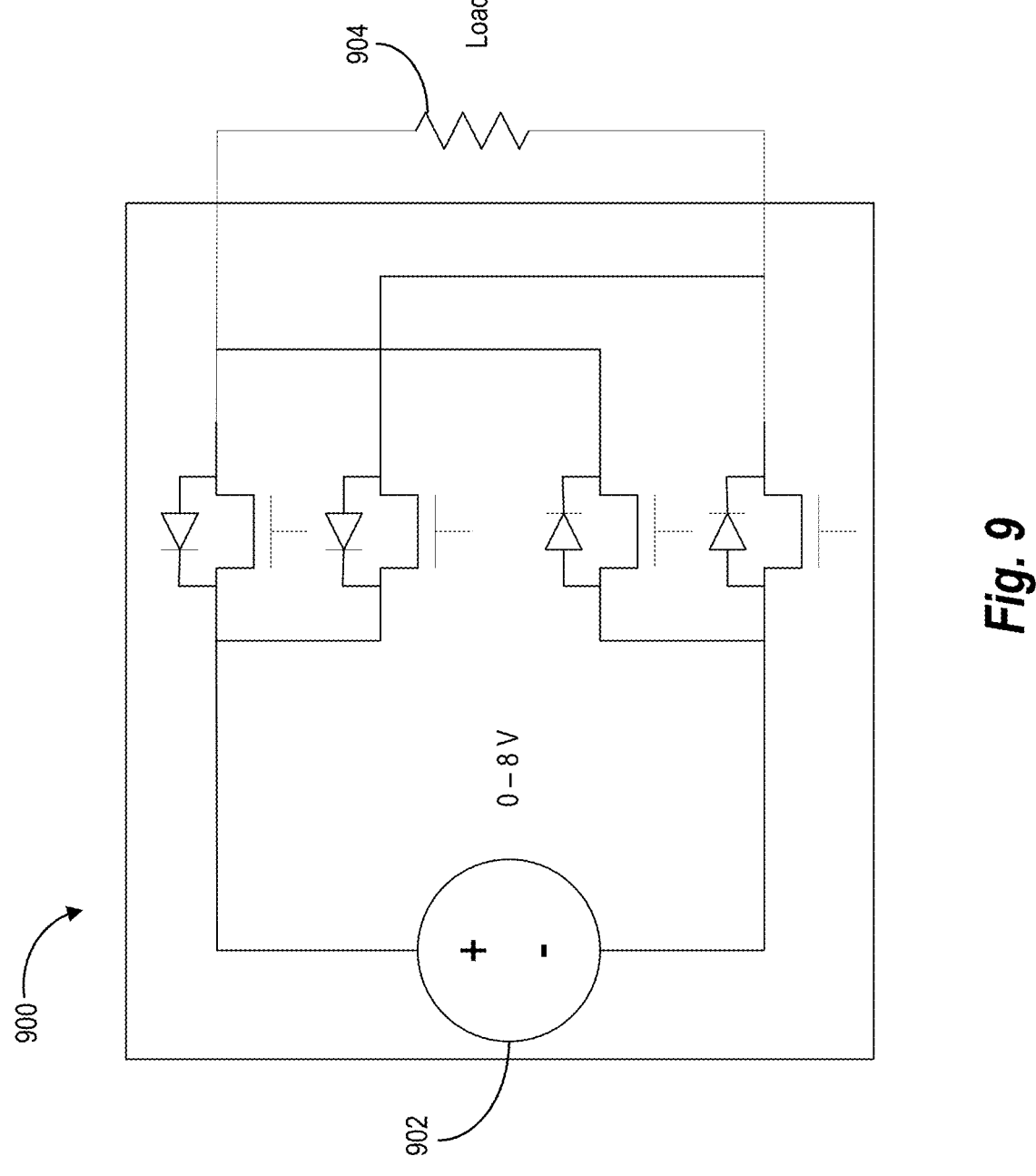
FIG. 9 illustrates a polarity reversal circuit between a rectifier circuit to an electrodeposition device load in accordance with one or more implementations.

FIG. 9 illustrates a polarity reversal circuit 900 for reversing polarity of a series-in-parallel-out rectifier circuit. For example, the electrodeposition system includes the polarity reversal circuit 900 between a bridge output of a direct current-to-direct current converter circuit (e.g., a brick component) of the series-in-parallel-out rectifier circuit and an electrodeposition device load. In particular, FIG. 9 illustrates an input signal 902 (e.g., representing an output voltage of a direct current-to-direct current converter circuit) and a load 904 (e.g., representing a portion of an electrodeposition device to which the direct current-to-direct current converter circuit is attached). To illustrate, the electrodeposition system can include a polarity reversal circuit for each brick component. Alternatively, the electrodeposition system can include a polarity reversal circuit for each direct current-to-direct current "phase."

In one or more embodiments, the polarity reversal circuit 900 includes a low speed/frequency and a low voltage. The electrodeposition system can utilize parallel polarity reversal circuits for loss targets according to a particular embodiment of an electrodeposition device. In additional embodiments, the switches of the polarity reversal circuit 900 carry only direct current (e.g., no ripple) due to receiving a direct current signal from a direct current-to-direct current converter circuit.

In one or more embodiments, the table below provides a summary of components of the electrodeposition system.

| Anode | The anode apparatus of the electrodeposition device. |
|---|---|
| Brick (or "brick component") | A direct current-to-direct current converter circuit that receives a direct current voltage from a Child Bus and outputs a direct current according to commands received over the Internal Communication Network. There is one Brick for every Child Bus. |

-continued

| | |
|---|---|
| Brick Communication Cable | A group of conductors that join the Bricks and Front End together in the Internal Communication Network. |
| DC Bus | The total direct current voltage output from the Front End. The DC Bus is the result of a series connection of all Child Busses. |
| Cathode | The cathode apparatus of the electrodeposition device. |
| Cathode Bus | A network of conductors or bus bars, or a combination thereof, that collect the output currents of the Bricks and feed them into the cathode of the electrodeposition device. |
| Child Bus (or "child direct current signal") | A direct current output voltage from the Front End that provides an input voltage to a single Brick |
| Child Bus Cable | A cable connecting the Front End to a pair of Bricks, joining the negative of one Brick input to the positive of another as illustrated in FIG. 6. |
| Control Interface | A communications port connecting the EDM Controller to the Front End. The Control Interface receives commands from the EDM Controller and reports telemetry, faults, and other data from the Shoebox system to the EDM Controller. |
| EDM Controller | The control apparatus of the electrodeposition device. |
| Fault Bus | A dedicated communication bus, or part of the ICN, that is specifically for signaling the highest priority faults. |
| Front End (or "front-end stage") | A front-end stage of a rectifier circuit including an alternating current-to-direct current converter circuit that receives a three-phase line voltage input and provides direct current outputs (Child Busses) connected to the Bricks. The Front End can have a Control Interface that communicates with the EDM Controller. It also participates in the Internal Communication Network. |
| Internal Communication Network (ICN) | A communication network that connects the Front End to the Bricks. Telemetry, faults, commands, and upgrade/downgrade information can all be communicated over the ICN. |
| Operations Technology (OT) Network | The TCP/IP network to which the EDM Controller and components of each rectifier circuit are connected. |
| Power Source | Standard three-phase power available as input to a rectifier circuit (e.g., 480 V, 60-Hz, with lines, ground, and neutral). |

The table below summarizes the components of a front-end stage of a series-in-parallel-out rectifier circuit.

| Component | Definition |
|---|---|
| Analog Interface Unit (AIU) | Circuits that convert high voltages and currents to low-level, appropriately isolated, signals that can be used by the Front End Control Unit. |
| Bus Capacitor ($C_{bus}$) | A bulk filter capacitor. |
| Bus Protection Unit (BPU) | A circuit that keeps the Bus Voltage and Bus Current operating in safe and reliable ranges by providing overcurrent and/or overvoltage protections. |
| Filter Inductors ($L_F$) | Line-frequency inductors used for filtering line-frequency current. |
| Front End Control Unit (FECU) | A control circuit that has a microcontroller and communications interfaces. It receives analog signals and provides appropriate communication and control signals. |
| Gate Drive Unit (GDU) | Circuit that senses the rectifier voltage and/or currents and causes the Synchronous Rectifier switches to switch on and off at the correct times. |
| Housekeeping Supply (HKS) | A circuit that provides the appropriate voltage supplies for all components of the front-end stage. |
| Power Entry Module (PEM) | A circuit that interfaces the alternating current line to the Front End, providing overcurrent protection, surge protection, and EMI filtering. |
| Synchronous Rectifier (SR) | A group of six power transistors that provide rectification of the line currents and connect to a bus voltage. |

The table below describes one or more embodiments of interfaces between the components.

| Component | To/from Component | Interface Requirement |
|---|---|---|
| Front End | EDM Controller | Via Control Interface: Ethernet 10/100 BASE-T, MODBUS (or other communications protocol) over TCP/IP. |

-continued

| Component | To/from Component | Interface Requirement |
|---|---|---|
| Front End | Brick | Child Bus Cable (for power) |
| Front End | Brick | Via Internal Communication Network: Four-wire serial communication cable and connector, I²C, CAN, or similar protocol. |

-continued

| Component | To/from Component | Interface Requirement |
|---|---|---|
| Front End | Power Source | Screw terminals for lines, neutral, and ground. |
| Front End | EDM Chassis | Screws, bolts, or other fasteners. |
| Front End | User | Visible LEDs or display indicating system status (mode). |
| Brick | Anode | Screws or bolts to bars or surfaces on anode. Thermal interface material between thermally conducting surfaces. |
| Brick | Cathode Bus | Screws, bolts, or other fasteners. |
| Cathode Bus | Cathode | Screws, bolts, or other fasteners. |

In one or more embodiments, the electrodeposition system handles faults or errors that affect the operation of one or more components of an electrodeposition device according to a state machine. In one or more embodiments, a controller of the electrodeposition system, a component of a portion of a rectifier circuit, or a computing device in communication with the controller manages the states of the electrodeposition device according to the state machine. Specifically, an error includes an abnormal operating condition, while a fault indicates an error that may cause damage or safety hazards. In some embodiments, errors are most frequent and typically recoverable. According to one or more embodiments, the electrodeposition system transitions to different modes (e.g., state transitions) in response to various errors, while non-error events may not cause a state transition.

In one or more embodiments, each error (and thus, each fault) has a code, short name, severity, and detailed description. For example, a severity of '1' is considered the highest severity (i.e., a fault). The electrodeposition system can utilize any number of severity classes below severity '1' according to the possible errors.

According to one or more embodiments, the system-level states (e.g., states for the electrodeposition system based on operation of series-in-parallel-out rectifier circuits and/or an electrodeposition device) are described in the table below.

| Mode (State) | Power Output | Errors | Faults |
|---|---|---|---|
| Idle_Normal | No | No | No |
| Invalid | No | No | Yes |
| Idle_Abnormal | No | Yes | No |
| Fault | No | Yes | Yes |
| Running_Normal | Yes | No | No |
| Invalid | Yes | No | Yes |
| Running_Abnormal | Yes | Yes | No |
| Invalid | Yes | Yes | Yes |

For example, the "invalid" state arises either because 1) the electrodeposition system experiences a fault without an error (violates the definition of error) or 2) the electrodeposition system experiences a power output occurring during a fault. The invalid states can indicate a programming or hardware bug.

Figure 10:
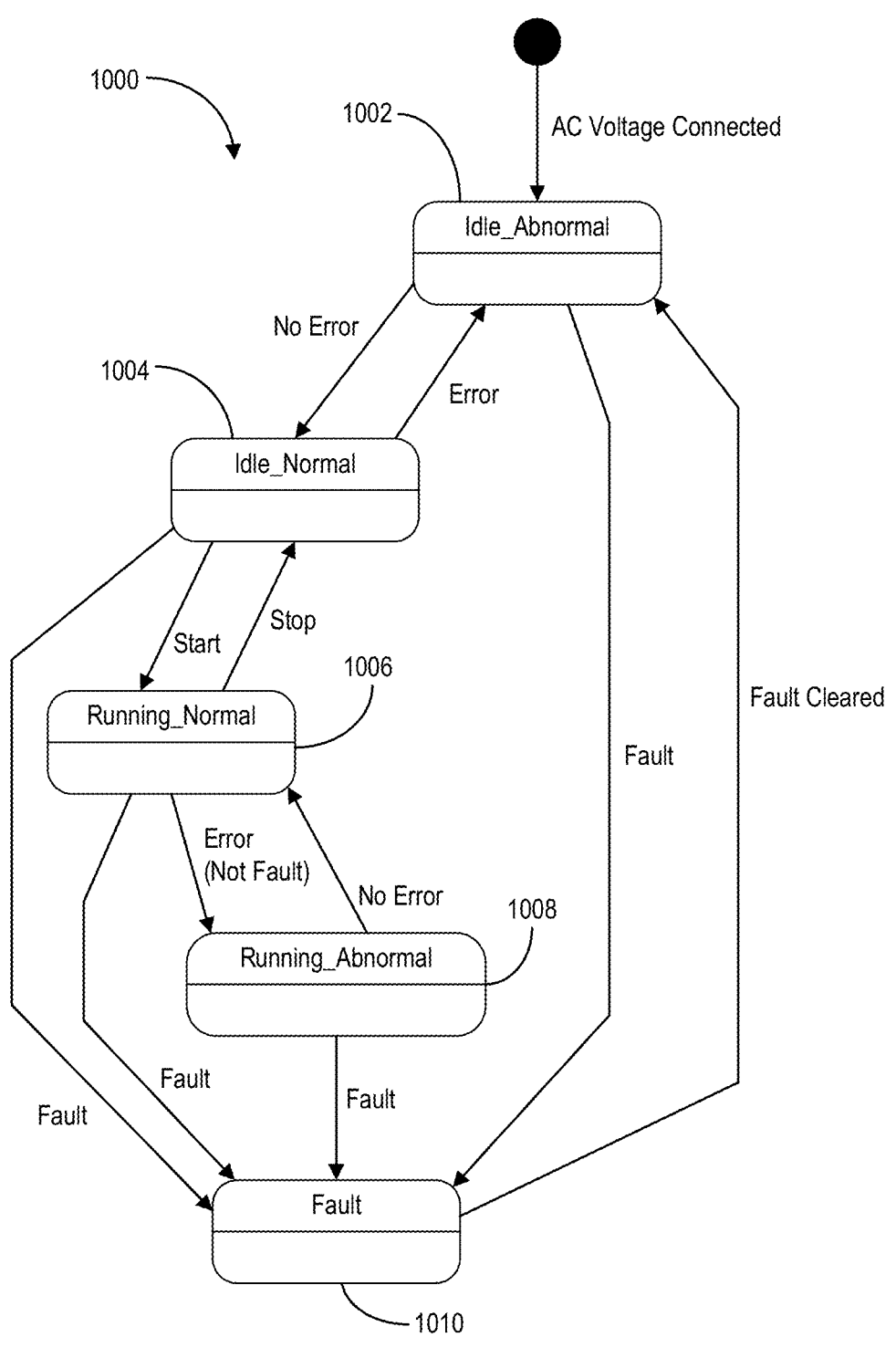
FIG. 10 illustrates a state transition diagram for the electrodeposition device of FIG. 1 in accordance with one or more implementations.

FIG. 10 illustrates a state transition diagram 1000 for determine when to transition the electrodeposition system from one state to another according to operation of the electrodeposition system. For example, as illustrated in FIG. 10, the system starts with power off (e.g., the alternating current power is disconnected, such as by disconnecting wires/plugs or with a switch or breaker). Once power is connected, the power supply for a front-end stage of a series-in-parallel-out rectifier circuit automatically powers up, which causes the control and communication circuits to power up automatically. Additionally, the electrodeposition system can power up each of the front-end stages of a plurality of series-in-parallel-out rectifier circuits connected to the electrodeposition system. By default, the electrodeposition system enters an Idle_Abnormal state 1002 on powering up.

The electrodeposition system can then perform checks on various subsystems or components, such as establishing communications with an electrodeposition device controller and with brick components of a series-in-parallel-out rectifier circuit. In response to determining that no errors are detected, the electrodeposition system transitions to an Idle_Normal state 1004. In the Idle_Normal state 1004, the electrodeposition system is in communication with the electrodeposition device controller and awaiting commands. In response to receiving a start command (such as a command to produce specific currents at one or more components of a back-end stage of a series-in-parallel-out rectifier circuit), the electrodeposition system transitions to a Running_Normal state 1006 and follows the command.

In one or more embodiments, the electrodeposition system remains in the Running_Normal state 1006 so long as no errors occur. If an error occurs (e.g., as detected by the device managing the states of the electrodeposition system), the electrodeposition system transitions to a Running_Abnormal state 1008 until clearing the error. The electrodeposition system can continue to respond to the command in the Running_Abnormal state 1008. If the error is (or becomes) a fault, then the electrodeposition system transitions to a Fault state 1010. In general, a fault causes a transition to the Fault state 1010, where the electrodeposition system stays until clearing the fault or power is removed.

Each state in the state transition diagram 1000 of FIG. 10 can have multiple substates as may serve a particular implementation. For example, substates of a particular state can be nested in several levels according to the specified errors/faults and/or hardware/software. For just one example, in the Running_Normal state 1006, the electrodeposition system may include a startup sequence that involves closing a relay, waiting for transients to settle, then ramping the current commands. In some embodiments, for simplicity and predictability, the electrodeposition system does not allow transitions between substates of different states. To illustrate, the electrodeposition system can allow transitions from a first substate of a first state to a second substate of the first state, but not from the first substate of the first state to a substate of a second state (e.g., without first resolving the first state). In some instances, the electrodeposition system may instead update the state transition diagram 1000 to preserve the intended segregation between states and substates.

According to one or more embodiments, a front-end stage of a series-in-parallel-out rectifier circuit (e.g., a controller or FECU of the front-end stage) runs the system level state machine. In such an embodiment, the table below provides additional detail regarding the operations the front-end stage performs in each state.

| State | Front End Behavior |
|-------|--------------------|
| Idle_Abnormal | The entry state upon receiving power from alternating current line terminals. The system defaults to an "abnormal" condition until it is positively confirmed to be normal with the absence of errors. While in this state, the Front End ensures that voltages and currents are within specification (e.g., specific thresholds). Since this state can only be exited by ensuring there are no Errors or Faults in the system, the Front End ensures that the Bus is powered up sufficiently so that the Bricks are also powered up. The Front End can verify communications (internal and with the EDM Controller) and Brick status. |
| Idle_Normal | The Front End is in communication with the EDM Controller waiting for commands from the EDM and monitoring for Errors. The commands can include start and stop commands (such as telling the electrodeposition system to drive a given current) and monitoring or status commands (such as reporting line voltage). |
| Running_Normal | The Front End has started (e.g., it has received a command to produce a current or voltage). The commands to start and stop can include target currents for each Brick, as well as ramp-up or ramp-down times, as appropriate. The Front End remains in communication with the EDM Controller, responding to data requests or adjustments to the current commands. |
| Running_Abnormal | The Front End is behaving as in the Running_Normal state, except there is at least one Error that is not a Fault. Such Errors can indicate a minor performance issue, such as an anomalous sensor reading or a temperature being close to a Fault threshold. |
| Fault | The Front End has an Error that meets Fault criteria. The Front End shuts down power to the electrodeposition device and reports the Fault condition. The Front End can only exit this state when receiving a command from the EDM Controller that the fault has been cleared. |

In one or more embodiments, a front-end stage and a back-end stage of a series-in-parallel-out rectifier circuit each has its own nonvolatile memory (e.g., non-transitory computer readable media) for storing data. For example, the electrodeposition system categorizes data as follows:

Operational Data—measurements such as voltage, current, power, power factor, efficiency, etc. that relate to the performance of the electrodeposition system.

Event Data—events preserved with counters.

In one or more embodiments, each component has sufficient nonvolatile memory to store both Operational Data and Event Data for a minimum preservation time (e.g., 24 hours). The electrodeposition system can timestamp the data and communicate the data at regular intervals to the electrodeposition device controller, which may then store the data permanently in a database. In one or more embodiments, the electrodeposition system utilizes the preservation time to allow backup in case of a network outage or communication failure that temporarily interrupts the ability to transfer data to the database.

In the case of Event Data, it is possible that repeated Events can cause counters to overflow. In this case, the electrodeposition system may size counters such that overflow is unlikely. In case of an overflow, however, the electrodeposition system can reset and timestamp the counters while recording the overflow in a database (e.g., in a separate computing device in communication with the electrodeposition system).

In one or more embodiments, the electrodeposition system utilizes embedded software running on the front-end stage and on each brick component to perform various operations associated with converting a single alternating current signal to a plurality of parallel direct current signals. Additionally, the electrodeposition system may use a single microcontroller unit ("MCU") for each hardware unit. The electrodeposition system can utilize the same programming language (e.g., C) for each microprocessor. Because the front-end stage and the corresponding back-end stage have different functions, the electrodeposition system may use different MCU architectures for each, though the electrodeposition system may use the same MCU architecture, as may serve a particular implementation.

In one or more embodiments, the front-end MCU provides supervisory functions for the electrodeposition system, including, but not limited to, communications, data management, safety, and upgrades. The front-end stage power conversion control loop may be relatively simple and low speed, such that the electrodeposition system may utilize a real-time operating system (RTOS) for the front-end stage. Because the brick components run a more intense power conversion control loop and do not handle the supervisory functions of the front-end stage, the electrodeposition system may utilize a simpler operating implementation for the brick components.

In one or more embodiments, the electrodeposition system supports updates to components of a series-in-parallel-out rectifier circuit through a control interface. The nonvolatile storage on both the front-end stage and the brick components may store a factory default image, an active image, and a previous image. A server or computing device may deliver a new image via a network connection while the electrodeposition system is in the Idle_Normal state, which may include stopping operation of the series-in-parallel-out rectifier circuit to initiate an upgrade before restarting. The electrodeposition system can check for errors or faults resulting from the upgrade.

According to one or more embodiments, the electrodeposition system programs MCUs for the brick components with a bootloader that looks for images in nonvolatile memory. If a new image is available, the electrodeposition system copies the active image to the previous image and replaces the active image with the new image. At each step, the electrodeposition system can store temporary copies of the images to ensure restoration of the electrodeposition system if an update fails. In addition, the electrodeposition system can provide each image with a data integrity check (e.g., a checksum or cyclical redundancy check) for verification upon each boot of the image. In response to an image failing an integrity check, the bootloader can revert to a previous image or the factory default image and issue an appropriate signal.

As mentioned, the electrodeposition system utilizes components that reduce weight and size over conventional systems. For example, each brick component may be approximately 1-2 kilograms to allow for installation, removal, or modification of a brick component by a single person. Additionally, each front-end stage may be less than 22 kilograms, such that the front-end stages and brick components are movable by a single person for easy installation, repositioning, or removal and to limit the total weight of the electrodeposition system. Furthermore, each front-end stage and brick component may include installation components for installation using hand tools and fastening hardware. The front-end stage and/or brick components may have enclosures with anodized and/or metal finishes for radiated heat transfer.

FIG. 11 illustrates an example of a mounting structure 1100 for attaching/mounting a portion of a rectifier circuit (e.g., a back-end stage or direct current-to-direct current converter circuit of a rectifier circuit) to an electrodeposition device. Specifically, the mounting structure 1100 includes components to provide a physical connection, electrical connection, and thermal connection from the portion of the rectifier circuit to a portion of the electrodeposition device. In one or more embodiments, the mounting structure 1100 connects the portion of the rectifier circuit to an anode of the electrodeposition device, such as to an outer surface of an anode bath of the electrodeposition device. Although FIGS. 11-17 are described in relation to a back-end stage of a rectifier circuit being mounted to a portion of an electrodeposition device via a mounting structure, in other embodiments, a mounting structure attaches one or more portions of a front end stage and/or a back end stage of a rectifier circuit (or other configuration of a rectifier circuit) to a portion of an electrodeposition device. Thus, references to mounting a back-end stage of a rectifier circuit to a mounting structure can additionally or alternatively include mounting any portion of a rectifier circuit to the mounting structure, such that one or more portions of the rectifier circuit (e.g., a front-end stage) may be mounted to the mounting structure or may be separate such that one or more portions of the rectifier circuit are not mounted to the mounting structure.

Figure 13:
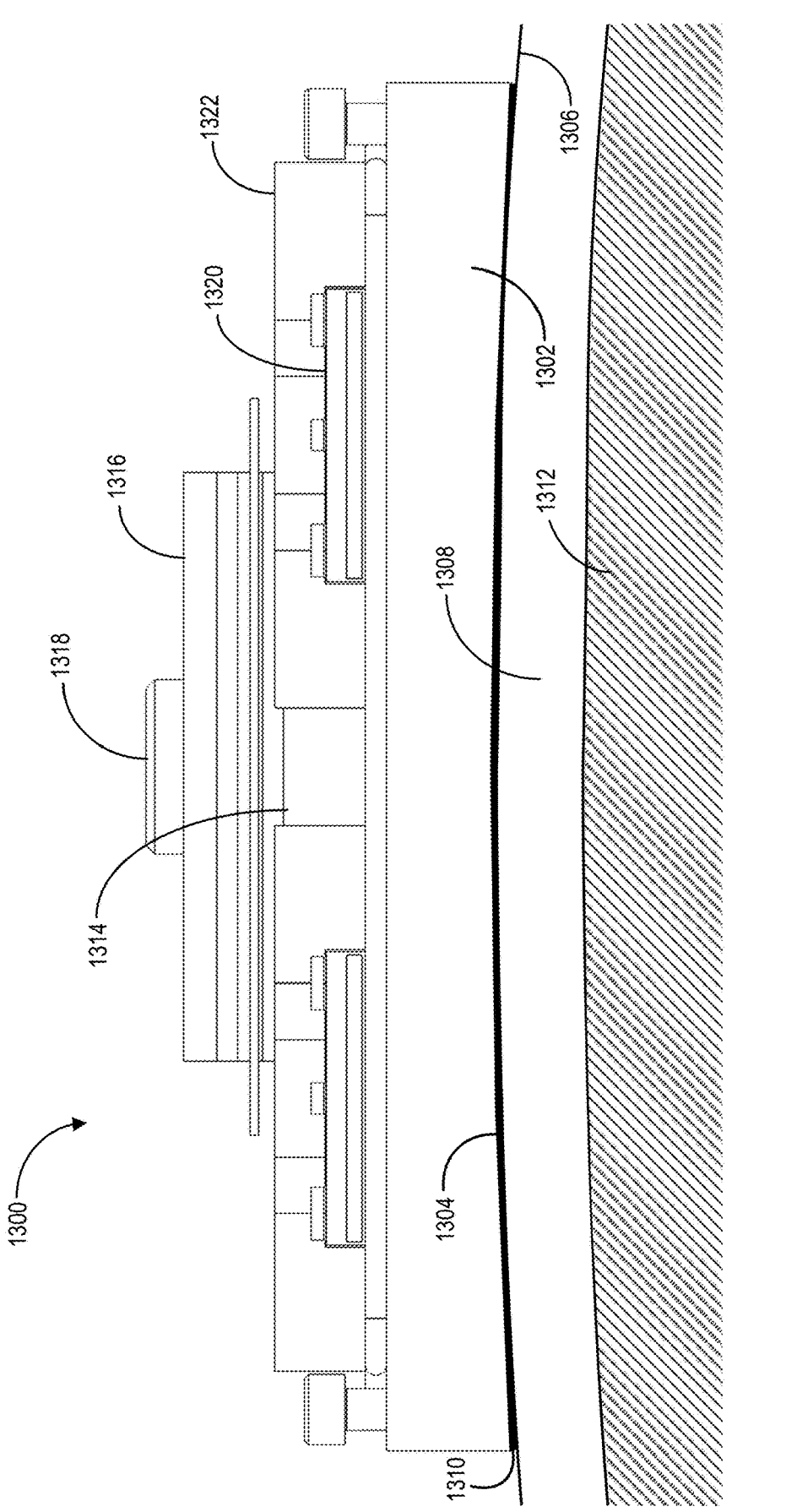
FIG. 13 illustrates a side view of a mounting structure for connecting a portion of a rectifier circuit to an electrodeposition device in accordance with one or more implementations.

In one or more embodiments, the mounting structure 1100 includes a bung element 1102 that provides one or more electrical connections between the back-end stage and the portion of the electrodeposition device. To illustrate, the bung element 1102 includes an electrically conductive material (e.g., an electrically conductive metal) to conduct a current from the back-end stage to the anode of the electrodeposition device (e.g., as shown in FIG. 13). For example, FIG. 11 illustrates that the bung element 1102 includes an electrically conductive material (e.g., titanium) to provide an electrical connection from one or more outputs of the back-end stage to the anode of the electrodeposition device according to the voltages and currents described above with respect to rectifier circuits.

Furthermore, the bung element 1102 can include a material that provides a physical connection between the back-end stage and the anode of the electrodeposition device. In some embodiments, the bung element 1102 includes a tensile strength to support the weight, clamp load, and/or contact pressure of a connection between the back-end stage and the anode of the electrodeposition device (e.g., equal to or within a threshold value of a tensile strength of titanium). For example, the bung element 1102 includes a size, thickness, and/or shape that allows a high clamp load and high contact pressure between a portion of the back-end stage (e.g., via a bus connector 1104 that mechanically isolates a circuit board of the back-end stage) and the anode. To illustrate, the bung element 1102 can include a cuboid shape (or approximately cuboid shape with beveled edges). In one or more embodiments, the back-end stage is physically secured to the bung element 1102 via a clamp element 1106. In additional embodiments, the bung element 1102 is physically secured to the anode via a welded connection (e.g., the bung element 1102 can be welded to an outer surface of the anode).

Accordingly, the mounting structure 1100 provides a physical and electrical connection between the back-end stage and a portion of the electrodeposition device via the bung element 1102. In additional embodiments, as mentioned, the mounting device also provides a thermal connection between the back-end stage and the portion of the electrodeposition device. Specifically, FIG. 11 illustrates that the mounting structure 1100 includes a base element 1108 that provides heat transfer from the back-end stage to the portion of the electrodeposition device. For instance, the base element 1108 includes a thermally conductive material (e.g., aluminum or copper) to conduct heat from the back-end stage to the portion of the electrodeposition device. Additionally, in some embodiments, the base element 1108 includes a shape and/or size to provide a surface to conduct heat generated by the back-end stage to the portion of the electrodeposition device. For example, the base element 1108 can be a rectangular aluminum element with a surface area equal to or larger than a surface area of a back-end stage (e.g., a circuit board of the back-end stage). Furthermore, in some embodiments, a thermal interface material (e.g., thermal grease or thermal paste) is disposed between the base element 1108 and the portion of the electrodeposition device to facilitate heat transfer from the mounting structure 1100 to the portion of the electrodeposition device.

According to one or more embodiments, the bung element 1102 includes one or more connector elements to connect the mounting structure 1100 to one or more additional elements and/or to hold one or more elements of the mounting structure 1100 together. For example, the mounting structure 1100 includes a plurality of bolts (e.g., bolt 1110) or other affixing elements that affix or otherwise attach one or more components to the mounting structure 1100 (e.g., via the bung element 1102). To illustrate, the mounting structure 1100 includes affixing elements that affix the clamp element 1106 and the bus connector 1104 to the bung element 1102. Alternatively, the clamp element 1106 includes one or more portions that affix directly to the base element 1108 via one or more affixing elements and apply a force on the bung element 1102 relative to the base element 1108.

Figure 14:
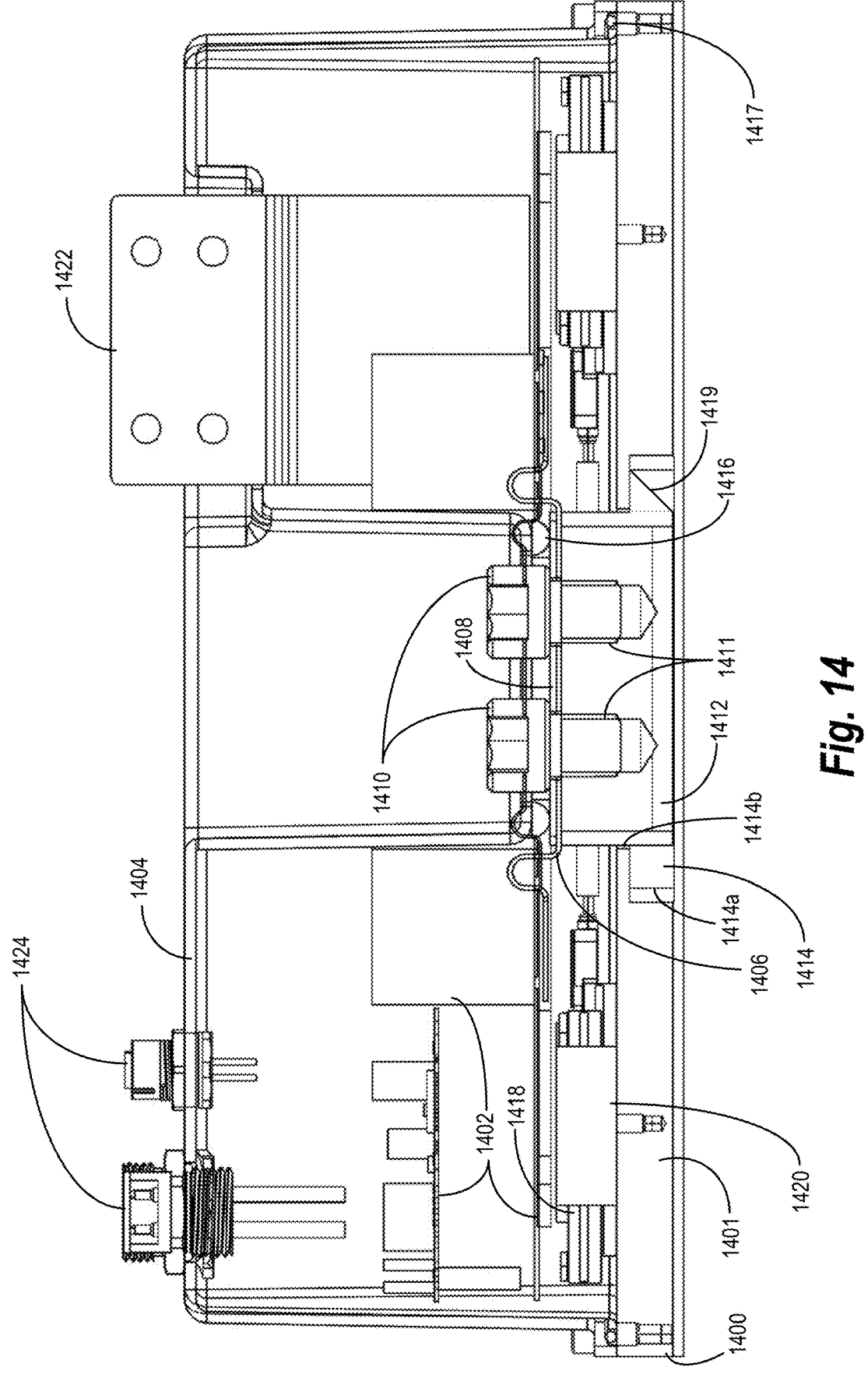
FIG. 14 illustrates a cross-section side view of a mounting structure and a rectifier circuit at least partially enclosed within an enclosure in accordance with one or more implementations.
Figure 16:
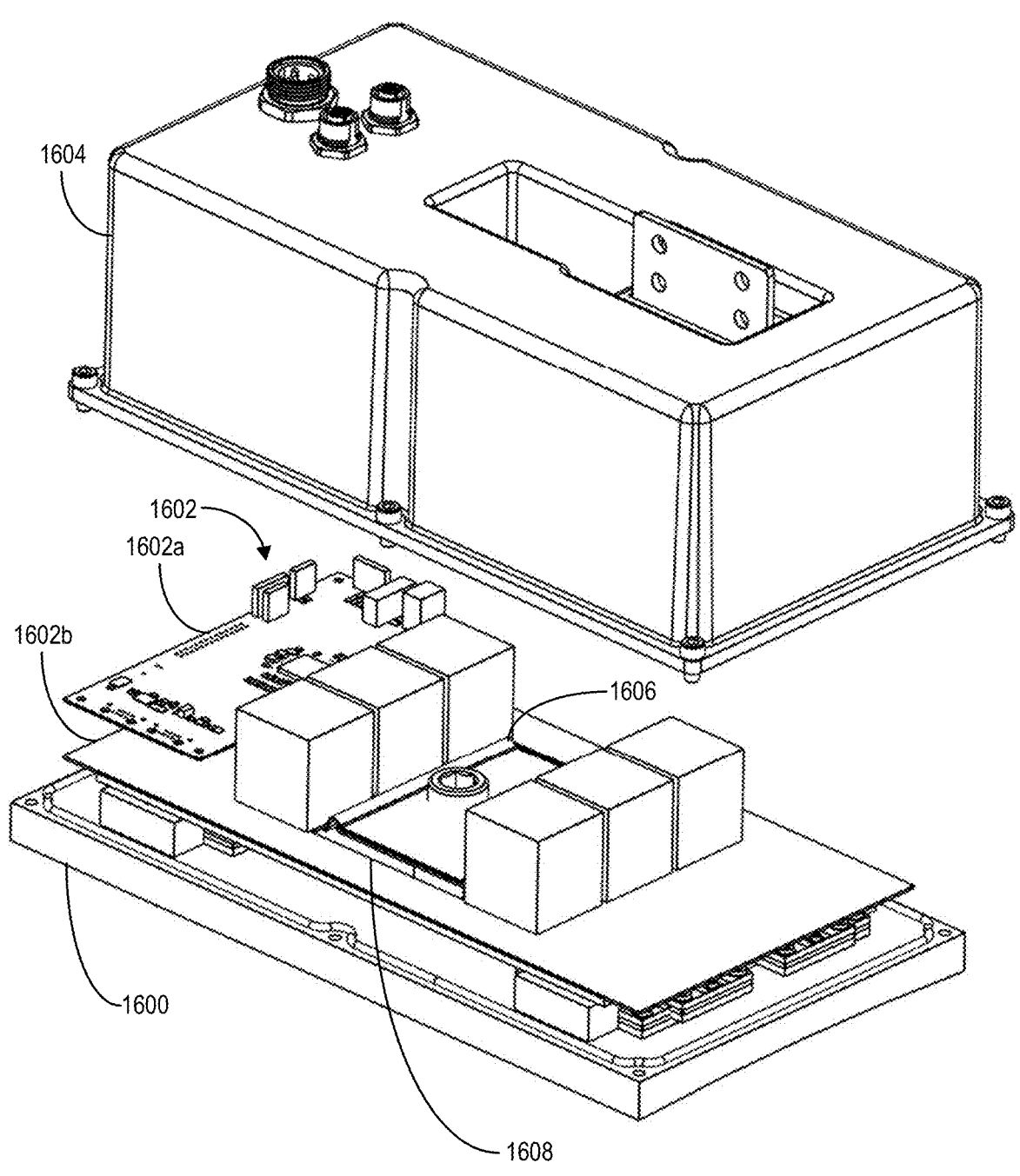
FIG. 16 illustrates an exploded isometric view of a mounting structure, a rectifier circuit, and an enclosure in accordance with one or more implementations.

In one or more embodiments, as mentioned, the mounting structure 1100 includes a clamp element 1106 that secures the back-end stage (e.g., the bus connector) to the mounting structure 1100 (e.g., as shown in FIGS. 14 and 16). For instance, the clamp element 1106 includes a c-shaped clamp (or a shape corresponding to a shape of the bung element 1102) that clamps the bus connector 1104 to the bung element 1102. In additional embodiments, the clamp element 1106 also applies a force on the bus connector 1104, the bung element 1102, and/or a base element 1108. For example, the clamp element 1106 can apply a preload force to the base element 1108 (e.g., via one or more wing portions 1111 and as further illustrated in FIG. 12) for providing contact pressure to the base element 1108 in relation to the portion of the electrodeposition device.

In one or more embodiments, the base element 1108 includes a hole 1109 (e.g., a cutout or molded hole) for the bung element 1102. In particular, the mounting structure 1100 includes the bung element 1102 disposed at least partially within the hole of the base element 1108 (e.g., as shown in more detail in FIGS. 12 and 14). Thus, the base element 1108 can surround a portion of the bung element 1102 (e.g., via the hole 1109), and in some cases can be at least partially in contact with the bung element 1102.

In one or more embodiments, the mounting structure 1100 (or the back-end stage of the rectifier circuit) includes a plurality of bus converter modules ("BCMs") (e.g., BCM 1112), or alternatively, "bus converter circuits" that convert a plurality of current signals in connection with the back-end stage. For example, the BCMs can include high-density, high-efficiency, fixed ratio (e.g., non-regulating) isolated circuits for converting direct current-to-direct current signals (e.g., to a lower voltage), which can result in a significant amount of heat generation. In one or more embodiments, the BCMs can be part of the back-end stage, such as the bus converter modules 826a-826b described above with respect to FIG. 8E, and can connect to one or more other components of the back-end stage via wires 1116. Accordingly, one or more components of a direct current-to-direct current converter circuit in a back-end stage of a series-in-parallel-out rectifier circuit can be attached to the mounting structure 1100 or to a circuit board attached to the mounting structure 1100. To illustrate, one or more components of a direct current-to-direct current converter circuit on a circuit board can communicate with the BCMs affixed to the mounting structure 1100 to generate an output signal to apply a current to a portion of the electrodeposition device.

As illustrated, the mounting structure 1100 also includes a sandwich clamp (e.g., sandwich clamp 1114) or other clamp in physical contact with one or more portions of a BCM (e.g., the BCM 1112) that attaches the BCM to the base element 1108 (e.g., via one or more screws or bolts for each sandwich clamp). The sandwich clamp 1114 can provide heat transfer from the BCM 1112 to the base element 1108. Specifically, by utilizing a sandwich clamp for each BCM, the mounting structure 1100 can provide heat transfer from a top surface and a bottom surface of the BCM (e.g., the top surface by way of the sandwich clamp and the bottom surface by way of direct contact between the BCM and the base element 1108). In some embodiments, the base element 1108 is also in contact with one or more additional blocks (e.g., aluminum blocks) including MOSFETs or other circuits associated with operating a back-end stage to transfer heat to the base element 1108.

As mentioned, in one or more embodiments, the mounting structure 1100 provides heat transfer from a back-end stage of a rectifier circuit to a portion of the electrodeposition device. Specifically, the mounting structure 1100 transfers heat from the back-end stage through the bung element 1102, the sandwich clamps, and/or the base element 1108 to the portion of the electrodeposition device. For example, the base element 1108 and/or the bung element 1102 transfer heat to a portion of a wall of an anode bath of the electrodeposition device. By transferring heat from the back-end stage to the wall of the anode bath, the electrodeposition device provides heat transfer via the anode bath and the electrolyte within the anode bath. Thus, the heat generated by the back-end stage is conducted through a wall of the anode into the electrolytic material in the anode bath of the electrodeposition device. In additional or alternative embodiments, the back-end stages include dedicated heat sinks (e.g., attached to the anode bath or otherwise in contact with the back-end stage or mounting structure 1100) to provide additional heat transfer.

Additionally, although FIG. 11 illustrates an example of a mounting structure 1100 including a bung element 1102 centralized within a base element 1108, in alternative embodiments, a mounting structure includes a plurality of bung elements. For example, the mounting structure can include a plurality of bung elements in physical and electrical contact with a back-end stage. Furthermore, the plurality of bung elements may be disposed within (or otherwise in thermal contact with) one or more base elements. To illustrate, the base element may include a plurality of holes for the plurality of bung elements. Alternatively, the mounting structure can include a separate base element for each of a plurality of bung elements.

Figure 12:
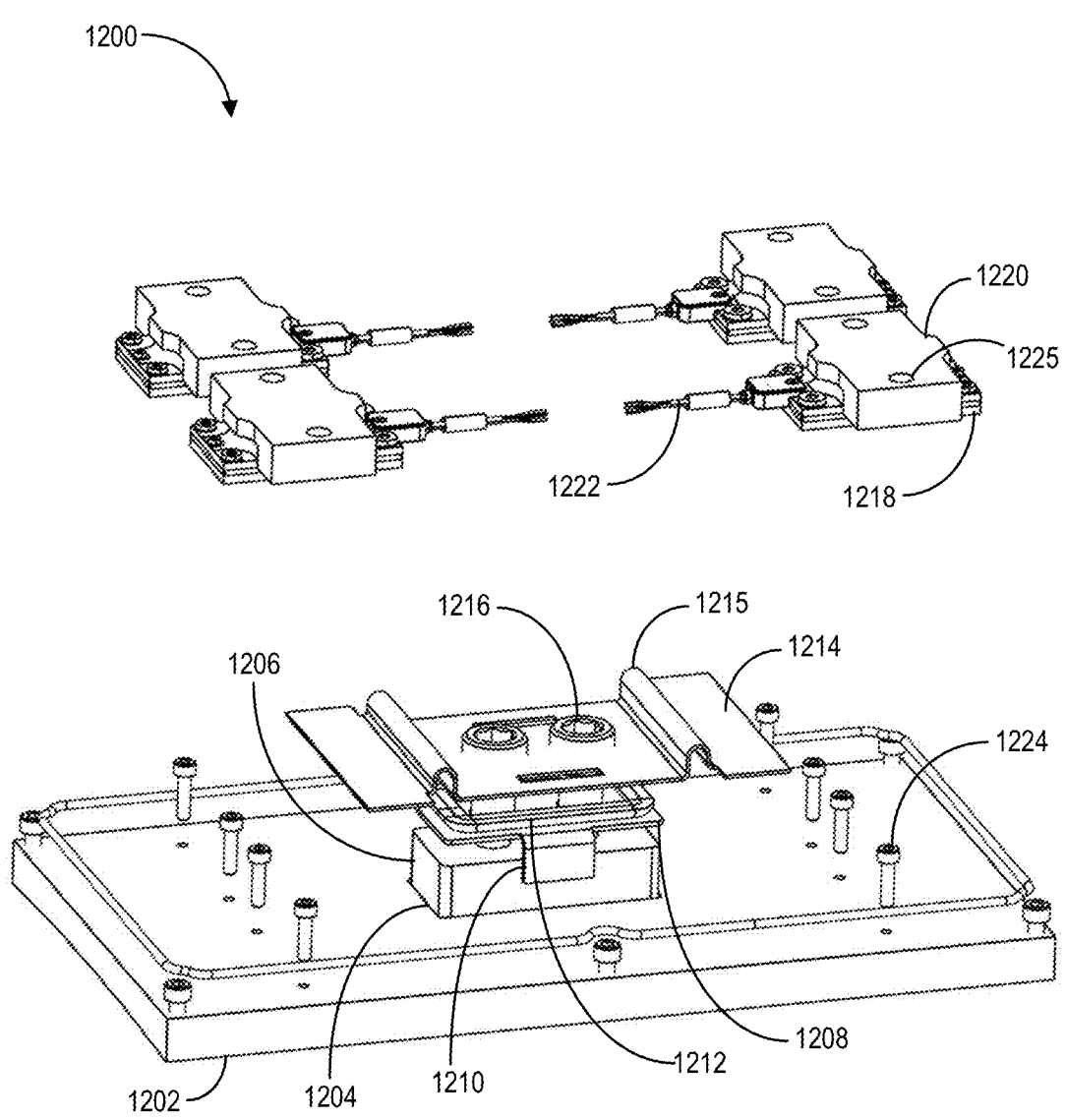
FIG. 12 illustrates an exploded isometric view of a mounting structure for connecting a portion of a rectifier circuit to an electrodeposition device in accordance with one or more implementations.

FIG. 12 illustrates an exploded view of a mounting structure 1200. For example, FIG. 12 illustrates that the mounting structure 1200 includes a base element 1202. The base element 1202 has a hole 1204 (e.g., a cutout or casted hole) in which a bung element 1206 is at least partially disposed. Furthermore, the mounting structure 1200 includes a clamp element 1208 with one or more wing portions on opposite sides (e.g., a wing portion 1210) to hold the bung element 1206 in place and/or to apply a preload force to the base element 1202. FIG. 12 also illustrates that a gasket 1212 (e.g., an o-ring or gasket having a shape similar to an upper surface of the bung element 1206) is disposed between the clamp element 1208 and a bus connector 1214 to provide a physical seal to an inner space formed by the mounting structure 1200 and an enclosure (e.g., as described in more detail below). Additionally, the exploded view of FIG. 12 also illustrates bolts (e.g., bolt 1216) that fasten various components (e.g., the clamp element 1208 and the bus connector 1214) to the bung element 1206.

FIG. 12 illustrates that the bus connector 1214 includes one or more flexible ridges (e.g., flexible ridge 1215) that provides a spring connection to a circuit board. For example, as described in more detail with respect to FIG. 16, the flexible ridges of the bus connector 1214 protrude above or into a hole or portion of a circuit board including one or more portions of a back-end stage of a rectifier circuit. Additionally, the flexible ridges can fasten the circuit board onto the bus connector 1214 via a force in the flexible ridges caused by the flexible ridges being in contact with one or more portions of the circuit board. Alternatively, the bus connector 1214 can include a single flexible ridge on one side and a rigid portion on the opposite side.

As shown in the exploded view of FIG. 12, the mounting structure 1200 also includes a plurality of BCMs (e.g., BCM 1218) with sandwich clamps (e.g., sandwich clamp 1220). The BCMs each include a set of electrical connectors (e.g., connector 1222) to send or receive electrical signals in connection with one or more components of a direct current-to-direct current converter circuit of a back-end stage. In some embodiments, the BCMs are attached to the base element 1202 of the mounting structure 1200 via one or more fasteners (e.g., bolt 1224 disposed within a fastener hole 1225 of the sandwich clamp 1220). By providing physical contact between the BCMs and the base element 1202 of the mounting structure 1200, and by providing physical contact between the sandwich clamps and the BCMs and between the sandwich clamps and the base element 1202, the mounting structure provides heat transfer from the BCMs to the base element 1202.

FIG. 13 illustrates a side view of a mounting structure 1300 including one or more portions of a back-end stage of a rectifier circuit. As illustrated, in one or more embodiments, a base element 1302 of the mounting structure 1300 includes a curved surface 1304. Specifically, a portion of an electrodeposition device to which the mounting structure 1300 is attached may have a curved surface (e.g., a curved outer wall 1306 of an anode bath 1308). Accordingly, the base element 1302 may have the curved surface 1304 to provide contact between the mounting structure 1300 and the curved surface of the portion of the electrodeposition device.

In one or more embodiments, the base element 1302 of the mounting structure 1300 is coupled to the portion of the electrodeposition device via a thermal interface material 1310. Specifically, the thermal interface material 1310 (e.g., a thermal grease or thermal paste) may be deposited between the curved surface 1304 of the base element 1302 and the curved outer wall 1306 of the anode bath 1308. For example, the thermal interface material 1310 can be disposed between any portion of the curved surface 1304 that comes in contact with the curved outer wall 1306 of the anode bath 1308. Furthermore, as previously mentioned, the anode bath 1308 can hold an electrolytic material 1312 for electrodeposition processes. By providing a thermal coupling between the mounting structure 1300 and the anode bath 1308, the mounting structure facilitates heat transfer to the electrolytic material 1312 contained within the anode bath 1308 through a wall of the anode bath 1308.

The side view of the mounting structure 1300 of FIG. 13 also illustrates a partial view of a bung element 1314 and a bus connector 1316 fastened together via a bolt 1318. Specifically, the bolt 1318 passes through a portion of the bus connector 1316 (and a clamp element, as illustrated in FIG. 12) into a portion of the bung element 1314. Furthermore, the mounting structure 1300 includes a plurality of BCMs (e.g., BCM 1320) fastened to the base element 1302. Additionally, each BCM is disposed at least partially within a sandwich clamp (e.g., clamp 1322) that is in physical contact with the BCM and the base element 1302.

In one or more embodiments, a mounting structure and/or a back-end stage may be at least partially contained within an enclosure. For instance, FIG. 14 illustrates a cross-section side view of a mounting structure 1400 and a back-end stage 1402 partially contained within an enclosure 1404. As illustrated, the back-end stage 1402 (e.g., one or more circuit boards of the back-end stage 1402) is attached to the mounting structure 1400 via a bus connector 1406, a clamp element 1408, and a plurality of bolts 1410. Specifically, as illustrated, the bolts 1410 are fastened to a bung element 1412 via a plurality of bore holes 1411 within the bung element 1412.

Additionally, as illustrated, the bung element 1412 is at least partially disposed within a hole 1414 of a base element 1401 of the mounting structure 1400. In one or more embodiments, the hole 1414 has a plurality of portions with different widths, lengths, or sizes along different depths of the base element 1401. To illustrate, the hole 1414 has a first width 1414a corresponding to a first portion at a first depth and a second width 1414b corresponding to a second portion at a second depth. In some embodiments, the bung element 1412 includes a lip 1419 or other element that causes one or more portions of the bung element 1412 to have a width greater than the second width 1414b and smaller than the first width 1414a such that assembly of the mounting structure 1400 involves inserting the bung element 1412 into the hole 1414 from below the base element 1401. To illustrate, the lip 1419 can include a protrusion from the bung element 1412 with an upper surface that abuts a lower surface formed at a transition between the first width 1414a and the second width 1414b of the hole 1414 of the base element 1401.

In one or more embodiments, the back-end stage 1402 is fastened to the bus connector 1406 via a hole or cutout within a circuit board of the back-end stage 1402 (e.g., as illustrated in FIG. 16). To illustrate, the bus connector 1406 can include a plurality of ridges or other protrusions that provide forces at edges of the hole within the circuit board of the back-end stage 1402. More specifically, the ridges or protrusions of the bus connector 1406 deform to clip into the hole of the circuit board and fasten the circuit board to the bus connector 1406. In some embodiments, the circuit board can be removed by squeezing ends of the bus connector 1406 (or otherwise applying a force to the ridges) to deform the ridges of the bus connector 1406 and loosen the connection between the circuit board and the bus connector 1406, thereby allowing removal of the circuit board. Such a connection allows for fast and easy disassembly of portions of the brick component for applying fixes to the circuit board and/or the mounting structure 1400.

FIG. 14 further illustrates that BCMs (e.g., BCM 1418) and corresponding sandwich clamps (e.g., sandwich clamp 1420) are positioned below the back-end stage 1402 within the enclosure 1404. Specifically, the back-end stage 1402 may be attached to the bus connector 1406 above the BCMs and sandwich clamps such that no portion of the back-end stage 1402 is in contact with the BCMs or sandwich clamps. This allows the BCMs and sandwich clamps to transfer heat to only the base element 1401 of the mounting structure 1400. Furthermore, in one or more embodiments, the enclosure 1404 is attached to the mounting structure 1400 (e.g., via one or more fasteners as shown in FIG. 15) and can include a protective material (e.g., an injection molded cover or a 3D-printed cover) for protecting components of the back-end stage 1402 and/or the mounting structure 1400.

FIG. 14 also illustrates a central gasket 1416 disposed between the enclosure 1404 and the clamp element 1408 to provide a seal between the enclosure and the clamp element 1408. In particular, a central portion of the enclosure 1404 may be open to provide access to the bolts 1410. Additionally, FIG. 14 illustrates that an outer gasket 1417 is disposed between the base element 1401 and the enclosure 1404 to seal an outer portion of the enclosure 1404. Thus, the central gasket 1416 and the outer gasket 1417 can seal and protect the back-end stage 1402 (including the BCMs) or other elements of the mounting structure 1400 within the enclosure 1404.

Figure 17:
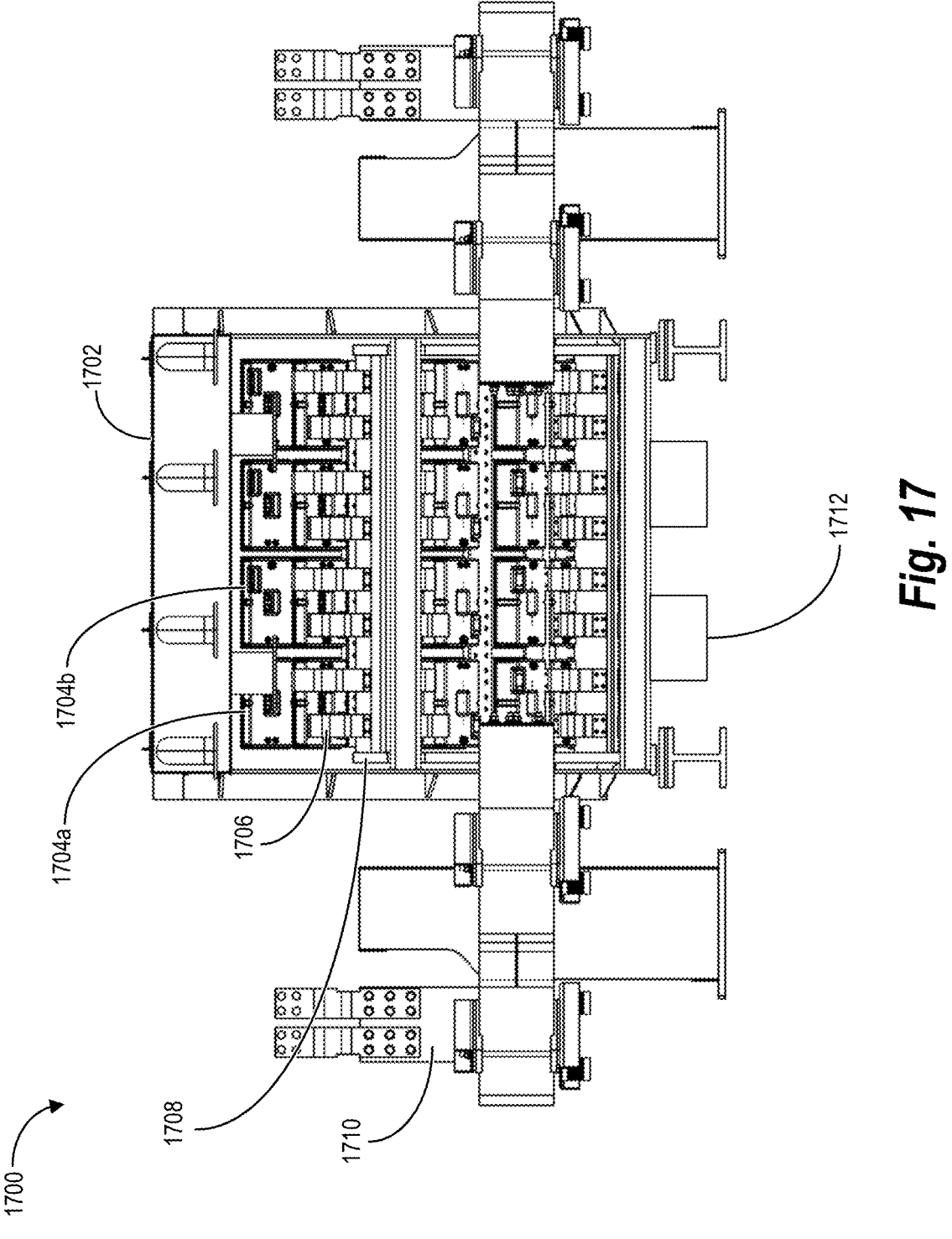
FIG. 17 illustrates a side view of a portion of an electrodeposition device including a plurality of brick components attached to an outer surface of an anode bath in accordance with one or more implementations.

In one or more embodiments, as illustrated, the enclosure 1404 also includes openings for additional components associated with operating the back-end stage 1402. For example, FIG. 14 illustrates that the enclosure includes an opening for a jumper 1422 to connect the back-end stage 1402 to one or more bus bars (e.g., as shown in FIG. 17). To illustrate, the jumper 1422 can provide power to the back-end stage (e.g., to the BCMs and/or one or more other components of the back-end stage). In additional embodiments, the enclosure 1404 includes one or more openings for one or more cable connectors 1424 for cables or wires that send or receive signals in connection with operating the back-end stage 1402 (e.g., to or from a front end circuit or a controller associated with the back-end stage 1402).

Figure 15:
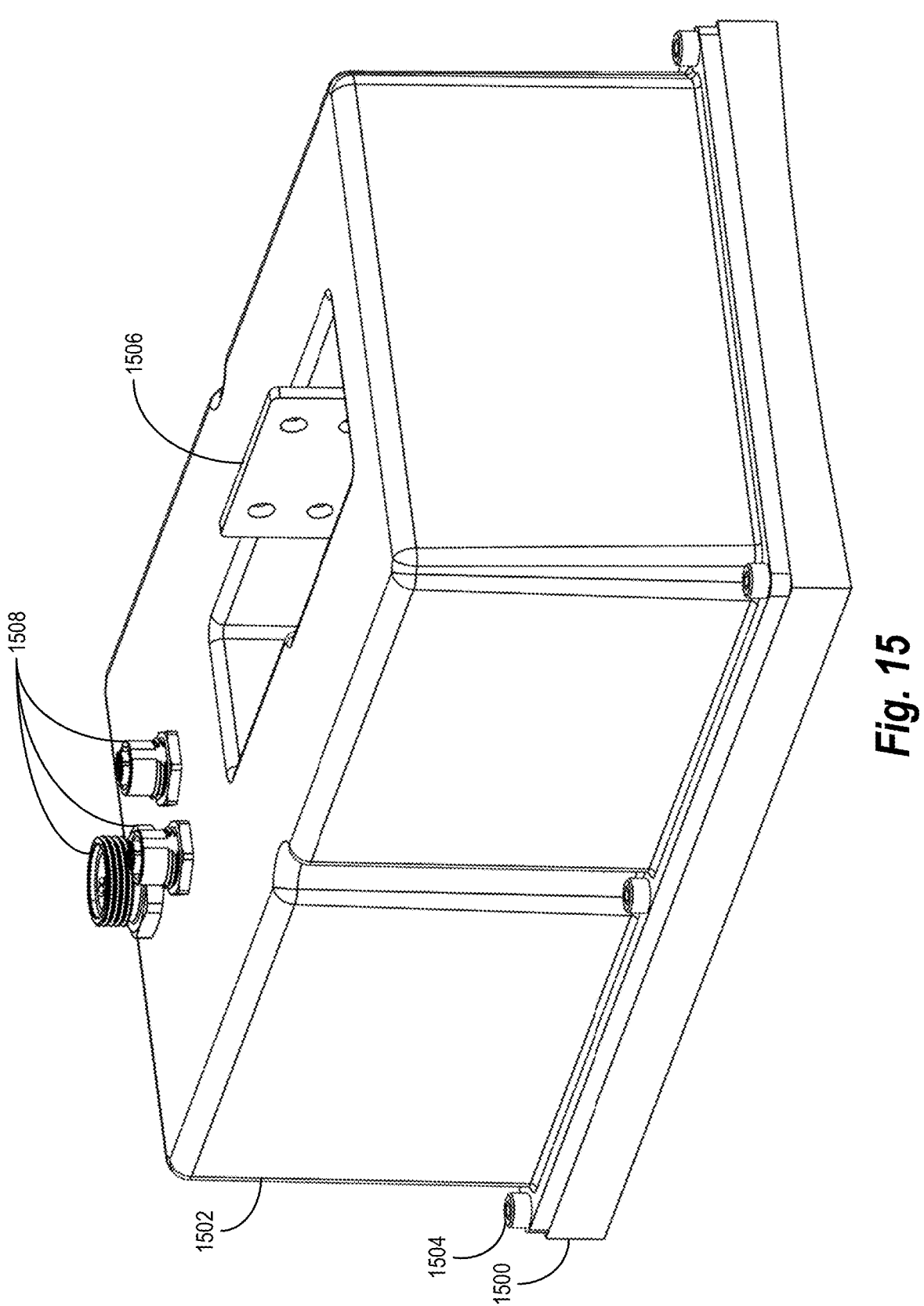
FIG. 15 illustrates an isometric view of a mounting structure partially enclosed within an enclosure in accordance with one or more implementations.

FIG. 15 illustrates an isometric view of the mounting structure 1500 with the enclosure 1502. In one or more embodiments, the mounting structure 1500 and the enclosure 1502 together form a brick component, as described above. As illustrated, the enclosure 1502 is affixed to the mounting structure 1500 via one or more fasteners (e.g., bolt 1504) to various locations of the mounting structure 1500 (e.g., via the base element of the mounting structure 1500). FIG. 15 also illustrates a jumper 1506 that connects to a bus bar to provide power to a back-end stage within the enclosure 1502. The enclosure 1502 of FIG. 15 also includes one or more cable connectors 1508 for cables or wires that send or receive signals in connection with operating the back-end stage within the enclosure 1502. In alternative embodiments, the back-end stage receives power via one or more cables, rather than a jumper connecting to a bus bar.

FIG. 16 includes an exploded view of a mounting structure 1600, a back-end stage 1602, and an enclosure 1604. In particular, as illustrated, the back-end stage 1602 is affixed to the mounting structure 1600 via a bus connector 1606 disposed at least partially within an opening 1608 of the back-end stage 1602 (e.g., a circuit board of the back-end stage 1602). More specifically, the bus connector can include a plurality of flexible ridges that are inserted into the opening 1608 of the back-end stage 1602 (e.g., a hole in a circuit board of the back-end stage 1602) and hold the back-end stage 1602 onto the bus connector 1606 by applying an outward force to an inward surface of the opening 1608. Additionally or alternatively, the back-end stage 1602 can be affixed to the mounting structure 1600 via one or more fasteners (e.g., bolts or screws), soldering, or welding connections with one or more circuit boards and one or more portions of the mounting structure 1600 (e.g., a bung element or a base element, as previously described). Furthermore, as illustrated, the back-end stage 1602 can include one or more circuit boards (e.g., circuit board 1602a and circuit board 1602b) with various integrated circuit components, resistors, capacitors, etc.

According to one or more embodiments, the electrodeposition device includes a plurality of mounting structures for mounting a plurality of back-end stages to the anode of the electrodeposition device. In particular, as previously mentioned, the electrodeposition device can include a plurality of back-end stages for distributing a plurality of electrical signals across the surface of the anode. Accordingly, the electrodeposition device can include a separate mounting structure for mounting each back-end stage to the surface of the anode. Thus, the electrodeposition device can include a plurality of brick components, each brick component including a separate direct current-to-direct current converter circuit and mounting structure mounted to a unique location of the surface of the anode.

FIG. 17 illustrates a side view of a portion of an electrodeposition device 1700 including a plurality of brick components, each including a separate direct current-to-direct current converter circuit of a back-end stage. For example, the electrodeposition device 1700 includes an anode bath 1702 that can contain an electrolyte for use in generating copper foil. Additionally, a plurality of brick components (e.g., a first brick component 1704a and a second brick component 1704b) containing direct current-to-direct current converter circuits are attached to an outer surface of the anode bath 1702. As mentioned, each brick component contains a separate direct current-to-direct current converter circuit affixed to a different portion of the anode bath 1702 via a separate mounting structure. Furthermore, in some embodiments, the brick components include an enclosure (e.g., as described previously). In other embodiments, the brick components do not include an enclosure.

Additionally, as illustrated, each brick component can include (or be attached to) a jumper (e.g., jumper 1706) that connects to a first bus bar 1708 to provide power to the corresponding brick component. In one or more embodiments, the first bus bar 1708 is attached to, or otherwise runs along, a portion of an outer surface of the anode bath 1702. To illustrate, the first bus bar 1708 is supported from the outer surface of the anode bath 1702 via an insulated mount on the outer surface of the anode bath 1702. Additionally, the electrodeposition device 1700 can include a second bus bar 1710 connected to a cathode drum (not shown in FIG. 17—FIG. 1 illustrates an example of a cathode drum connected to a bus bar). FIG. 17 also illustrates that the electrodeposition device 1700 can include one or more front end stages (e.g., front end stage 1712) that connect to a plurality of back-end stages. In one or more embodiments, a single front end stage or controller can control current/voltage to a plurality of back-end stages of a plurality of rectifier circuits.

Embodiments of the present disclosure may comprise or utilize a special purpose or general-purpose computer including computer hardware, such as, for example, one or more processors and system memory, as discussed in greater detail below. Embodiments within the scope of the present disclosure also include physical and other computer-readable media for carrying or storing computer-executable instructions and/or data structures. In particular, one or more of the processes described herein may be implemented at least in part as instructions embodied in a non-transitory computer-readable medium and executable by one or more computing devices (e.g., any of the media content access devices described herein). In general, a processor (e.g., a microprocessor) receives instructions, from a non-transitory computer-readable medium, (e.g., memory), and executes those instructions, thereby performing one or more processes, including one or more of the processes described herein.

Computer-readable media can be any available media that can be accessed by a general purpose or special purpose computer system. Computer-readable media that store computer-executable instructions are non-transitory computer-readable storage media (devices). Computer-readable media that carry computer-executable instructions are transmission media. Thus, by way of example, and not limitation, embodiments of the disclosure can comprise at least two distinctly different kinds of computer-readable media: non-transitory computer-readable storage media (devices) and transmission media.

Non-transitory computer-readable storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to non-transitory computer-readable storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that non-transitory computer-readable storage media (devices) can be included in computer system components that also (or even primarily) utilize transmission media.

Computer-executable instructions comprise, for example, instructions and data which, when executed by a processor, cause a general-purpose computer, special purpose computer, or special purpose processing device to perform a certain function or group of functions. In some embodiments, computer-executable instructions are executed by a general-purpose computer to turn the general-purpose computer into a special purpose computer implementing elements of the disclosure. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Embodiments of the present disclosure can also be implemented in cloud computing environments. As used herein, the term "cloud computing" refers to a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly.

A cloud-computing model can be composed of various characteristics such as, for example, on-demand self-service, broad network access, resource pooling, rapid elasticity, measured service, and so forth. A cloud-computing model can also expose various service models, such as, for example, Software as a Service ("SaaS"), Platform as a Service ("PaaS"), and Infrastructure as a Service ("IaaS"). A cloud-computing model can also be deployed using different deployment models such as private cloud, community cloud, public cloud, hybrid cloud, and so forth. In addition, as used herein, the term "cloud-computing environment" refers to an environment in which cloud computing is employed.

illustrates a block diagram of an example computing device 1800 that may be configured to perform one or more of the processes described above. One will appreciate that one or more computing devices, such as the computing device 1800 may represent the computing devices described above. In one or more embodiments, the computing device 1800 may be a mobile device (e.g., a mobile telephone, a smartphone, a PDA, a tablet, a laptop, a camera, a tracker, a watch, a wearable device, etc.). In some embodiments, the computing device 1800 may be a non-mobile device (e.g., a desktop computer or another type of client device). Further, the computing device 1800 may be a server device that includes cloud-based processing and storage capabilities.

Figure 18:
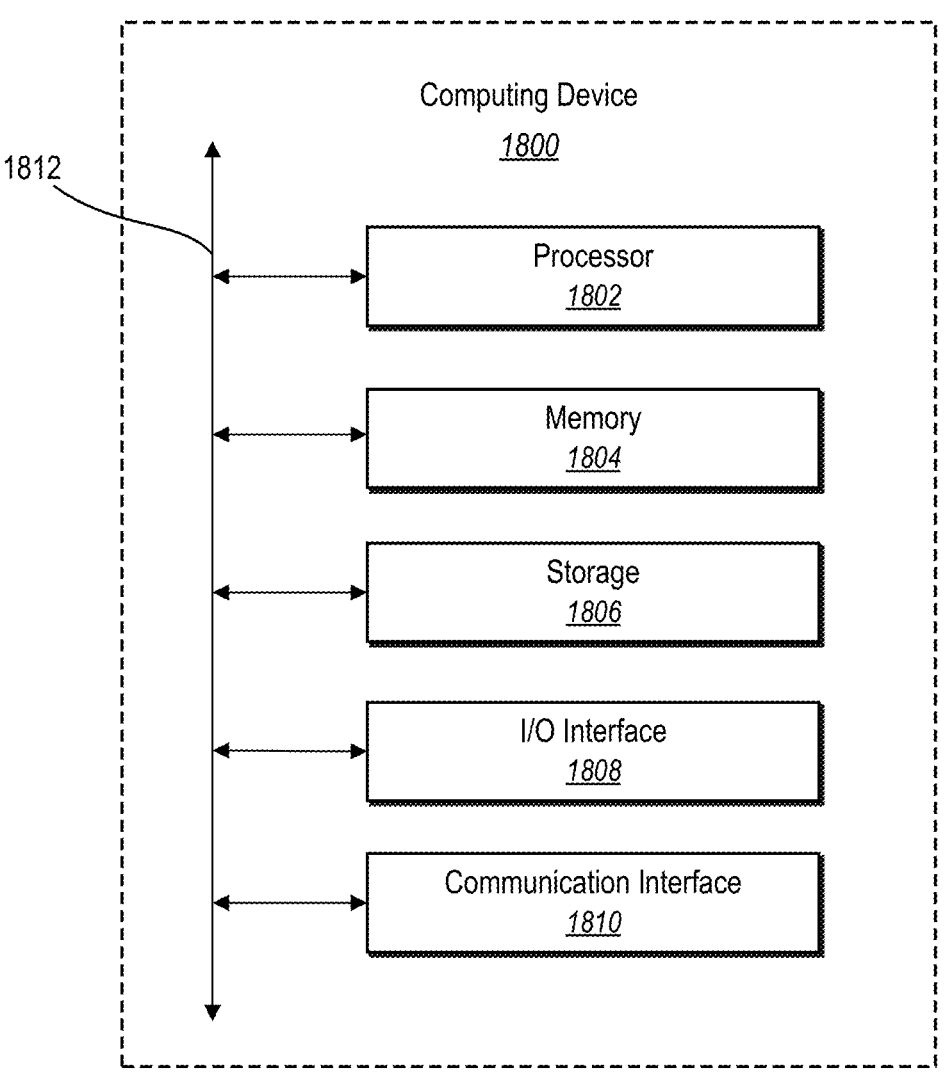
FIG. 18 illustrates a block diagram of an example computing device for implementing one or more implementations.

As shown in FIG. 18, the computing device 1800 can include one or more processor(s) 1802, memory 1804, a storage device 1806, input/output interfaces 1808 (or "I/O interfaces 1808"), and a communication interface 1810, which may be communicatively coupled by way of a communication infrastructure (e.g., bus 1812). While the computing device 1800 is shown in FIG. 18, the components illustrated in FIG. 18 are not intended to be limiting. Additional or alternative components may be used in other embodiments. Furthermore, in certain embodiments, the computing device 1800 includes fewer components than those shown in FIG. 18. Components of the computing device 1800 shown in FIG. 18 will now be described in additional detail.

In particular embodiments, the processor(s) 1802 includes hardware for executing instructions, such as those making up a computer program. As an example, and not by way of limitation, to execute instructions, the processor(s) 1802 may retrieve (or fetch) the instructions from an internal register, an internal cache, memory 1804, or a storage device 1806 and decode and execute them.

The computing device 1800 includes memory 1804, which is coupled to the processor(s) 1802. The memory 1804 may be used for storing data, metadata, and programs for execution by the processor(s). The memory 1804 may include one or more of volatile and non-volatile memories, such as Random-Access Memory ("RAM"), Read-Only Memory ("ROM"), a solid-state disk ("SSD"), Flash, Phase Change Memory ("PCM"), or other types of data storage. The memory 1804 may be internal or distributed memory.

The computing device 1800 includes a storage device 1806 includes storage for storing data or instructions. As an example, and not by way of limitation, the storage device 1806 can include a non-transitory storage medium described above. The storage device 1806 may include a hard disk drive (HDD), flash memory, a Universal Serial Bus (USB) drive or a combination these or other storage devices.

As shown, the computing device 1800 includes one or more I/O interfaces 1808, which are provided to allow a user to provide input to (such as user strokes), receive output from, and otherwise transfer data to and from the computing device 1800. These I/O interfaces 1808 may include a mouse, keypad or a keyboard, a touch screen, camera, optical scanner, network interface, modem, other known I/O devices or a combination of such I/O interfaces 1808. The touch screen may be activated with a stylus or a finger.

The I/O interfaces 1808 may include one or more devices for presenting output to a user, including, but not limited to, a graphics engine, a display (e.g., a display screen), one or more output drivers (e.g., display drivers), one or more audio speakers, and one or more audio drivers. In certain embodiments, I/O interfaces 1808 are configured to provide graphical data to a display for presentation to a user. The graphical data may be representative of one or more graphical user interfaces and/or any other graphical content as may serve a particular implementation.

The computing device 1800 can further include a communication interface 1810. The communication interface 1810 can include hardware, software, or both. The communication interface 1810 provides one or more interfaces for communication (such as, for example, packet-based communication) between the computing device and one or more other computing devices or one or more networks. As an example, and not by way of limitation, communication interface 1810 may include a network interface controller (NIC) or network adapter for communicating with an Ethernet or other wire-based network or a wireless NIC (WNIC) or wireless adapter for communicating with a wireless network, such as a WI-FI. The computing device 1800 can further include a bus 1812. The bus 1812 can include hardware, software, or both that connects components of computing device 1800 to each other.

In the foregoing specification, the invention has been described with reference to specific example embodiments thereof. Various embodiments and aspects of the invention(s) are described with reference to details discussed herein, and the accompanying drawings illustrate the various embodiments. The description above and drawings are illustrative of the invention and are not to be construed as limiting the invention. Numerous specific details are described to provide a thorough understanding of various embodiments of the present invention.

The present invention may be embodied in other specific forms without departing from its spirit or essential characteristics. The described embodiments are to be considered in all respects only as illustrative and not restrictive. For example, the methods described herein may be performed with less or more steps/acts or the steps/acts may be performed in differing orders. Additionally, the steps/acts described herein may be repeated or performed in parallel to one another or in parallel to different instances of the same or similar steps/acts. The scope of the invention is, therefore, indicated by the appended claims rather than by the foregoing description. All changes that come within the meaning and range of equivalency of the claims are to be embraced within their scope.

What is claimed is:

1. An electrodeposition device comprising:
an anode and a cathode for depositing material on a deposition surface;
a rectifier circuit that generates one or more current signals to apply to a surface of the anode; and
a mounting structure comprising an electrically conductive bung element physically and electrically connected to at least one portion of the rectifier circuit and the surface of the anode, the electrically conductive bung element disposed at least partially within a thermally conductive base element coupled to the surface of the anode.

2. The electrodeposition device of claim 1, wherein:
the anode comprises an anode bath including an electrolytic material within a recess of the anode; and
the cathode comprises a cathode drum positioned at least partially within the anode bath of the anode.

3. The electrodeposition device of claim 1, wherein:
the rectifier circuit comprises a plurality of converter circuits generating a plurality of current signals; and
the mounting structure mounts a converter circuit of the plurality of converter circuits to the surface of the anode.

4. The electrodeposition device of claim 3, wherein the electrically conductive bung element is in electrical contact with an output terminal of the converter circuit and the surface of the anode to provide a current signal of the one or more current signals from the converter circuit to the surface of the anode.

5. The electrodeposition device of claim 3, wherein the thermally conductive base element comprises a thermally conductive material that conducts heat generated by the converter circuit to the surface of the anode.

6. The electrodeposition device of claim 5, wherein the thermally conductive base element comprises a surface area equal to or greater than a surface area of a circuit board of the converter circuit.

7. The electrodeposition device of claim 1, wherein the mounting structure comprises a clamp element that clamps a bus connector in electrical contact with the at least one portion of the rectifier circuit to the electrically conductive bung element by applying a force on the bus connector relative to the thermally conductive base element.

8. The electrodeposition device of claim 7, wherein the clamp element comprises one or more wing portions that apply a preload force to the thermally conductive base element relative to the surface of the anode.

9. The electrodeposition device of claim 7, wherein the at least one portion of the rectifier circuit is affixed to the mounting structure via a plurality of flexible ridges inserted into an opening of the at least one portion of the rectifier circuit, the plurality of flexible ridges applying an outward force to an inward surface of the opening of the at least one portion of the rectifier circuit.

10. The electrodeposition device of claim 1, wherein:
the thermally conductive base element comprises a hole including a first width at a first depth and a second width at a second depth, the first width being greater than the second width; and
a portion of the electrically conductive bung element is at least partially disposed within the hole of the thermally conductive base element, the portion of the electrically conductive bung element comprising a width narrower than the second width.

11. The electrodeposition device of claim 1, wherein the mounting structure further comprises an enclosure affixed to the thermally conductive base element of the mounting structure and enclosing the at least one portion of the rectifier circuit within a space between the enclosure and the thermally conductive base element, the enclosure comprising:
an opening for a jumper connecting the at least one portion of the rectifier circuit to a bus bar; and
one or more cable connectors providing one or more signals from an additional portion of the rectifier circuit to the at least one portion of the rectifier circuit within the enclosure.

12. An electrodeposition device comprising:

an anode and a cathode for depositing material on a deposition surface;

a rectifier circuit comprising:

an alternating current-to-direct current converter circuit that generates one or more direct current signals from an alternating current signal; and a plurality of direct current-to-direct current converter circuits that generate, from the one or more direct current signals, a plurality of child direct current signals to apply to a surface of the anode; and a mounting structure comprising an electrically conductive bung element physically and electrically connected to a direct current-to-direct current converter circuit of the plurality of direct current-to-direct current converter circuits of the rectifier circuit and the surface of the anode, the electrically conductive bung element disposed at least partially within a thermally conductive base element coupled to the surface of the anode.

13. The electrodeposition device of claim 12, further comprising a plurality of mounting structures coupling the plurality of direct current-to-direct current converter circuits to a plurality of positions of the surface of the anode, the plurality of mounting structures providing electrical contact and physical contact between the plurality of direct current-to-direct current converter circuits to the surface of the anode.

14. The electrodeposition device of claim 12, wherein the electrically conductive bung element is in electrical contact with an output terminal of the direct current-to-direct current converter circuit and the surface of the anode, the electrically conductive bung element conducting a child direct current signal generated by the direct current-to-direct current converter circuit to the surface of the anode.

15. The electrodeposition device of claim 12, wherein the mounting structure comprises a clamp element applying a force to the electrically conductive bung element relative to the thermally conductive base element and a preload force to the thermally conductive base element relative to the surface of the anode, the thermally conductive base element comprising a curved surface corresponding to a curved outer wall of the surface of the anode.

16. The electrodeposition device of claim 15, wherein the mounting structure comprises a clamp element that clamps a bus connector in electrical contact with the direct currentto-direct current converter circuit of the plurality of direct current-to-direct current converter circuits to the electrically conductive bung element by applying a force on the bus connector relative to the thermally conductive base element.

17. The electrodeposition device of claim 12, wherein the mounting structure comprises a plurality of bus converter circuits attached to an upper surface of the thermally conductive base element, the plurality of bus converter circuits providing a plurality of power signals to the direct current-to-direct current converter circuit.

18. A circuit mounting structure comprising:

a thermally conductive base element comprising a hole through a thickness of the thermally conductive base element, the thermally conductive base element coupled to a surface of an anode of an electrodeposition device;

an electrically conductive bung element at least partially disposed within the hole of the thermally conductive base element and electrically connected to the surface of an anode of an electrodeposition device; and a bus connector in electrical contact with the electrically conductive bung element and at least one portion of a rectifier circuit that generates one or more current signals to apply to the surface of the anode via the electrically conductive bung element.

19. The circuit mounting structure of claim 18, further comprising an enclosure affixed to the thermally conductive base element, the enclosure enclosing the at least one portion of the rectifier circuit within a space between the enclosure and the thermally conductive base element, the enclosure comprising:

a jumper connecting the at least one portion of the rectifier circuit to a bus bar of the electrodeposition device via one or more openings of the enclosure; and one or more cable connectors providing one or more signals from an additional portion of the rectifier circuit to the at least one portion of the rectifier circuit via the one or more openings of the enclosure.

20. The circuit mounting structure of claim 18, further comprising a clamp element that clamps the bus connector to the electrically conductive bung element, the clamp element comprising wing portions that apply a preload force to the thermally conductive base element relative to the surface of the anode.

\* \* \* \* \*